United States Patent
Gianetto et al.

(10) Patent No.: US 10,430,463 B2
(45) Date of Patent: Oct. 1, 2019

(54) SYSTEMS AND METHODS FOR GENERATING A WEIGHTED PROPERTY GRAPH DATA MODEL REPRESENTING A SYSTEM ARCHITECTURE

(71) Applicant: Raytheon Company, Waltham, MA (US)

(72) Inventors: David Aaron Gianetto, Palos Verdes Estates, CA (US); Stephanie Sharo Chiesi, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 308 days.

(21) Appl. No.: 15/460,451

(22) Filed: Mar. 16, 2017

(65) Prior Publication Data

US 2018/0268077 A1 Sep. 20, 2018

(51) Int. Cl.
*G06F 16/901* (2019.01)
*G06F 16/28* (2019.01)
(Continued)

(52) U.S. Cl.
CPC ........ *G06F 16/9024* (2019.01); *G06F 16/185* (2019.01); *G06F 16/20* (2019.01);
(Continued)

(58) Field of Classification Search
CPC .... G06F 16/28; G06F 16/288; G06F 16/9027; G06F 16/9024; G06F 16/24;
(Continued)

(56) References Cited

U.S. PATENT DOCUMENTS 5,640,327 A 6/1997 Ting
5,748,844 A 5/1998 Marks
(Continued)

FOREIGN PATENT DOCUMENTS

WO WO-2015019364 A2 2/2015
WO WO-2016048144 A1 3/2016
(Continued)

OTHER PUBLICATIONS

"U.S. Appl. No. 15/460,443, Non Final Office Action dated Feb. 14, 2019", 36 pgs.
(Continued)

*Primary Examiner* — James Trujillo
*Assistant Examiner* — Michal Lawrence Bogacki
(74) *Attorney, Agent, or Firm* — Schwegman Lundberg & Woessner, P.A,

(57) ABSTRACT

A system and method generates a weighted property graph data model to represent a system architecture. The model includes a plurality of vertices representing a plurality of instances of a design dimension of the system architecture, a plurality of weighted compositional edges that connect first pairs of vertices to represent hierarchical directed-composition and hierarchical directed-decomposition of first pairs of instances of the design dimension represented by the corresponding connected first pairs of vertices with respect to one another, and a plurality of weighted interface edges that connect second pairs of the vertices to represent an information exchange interface between second pairs of instances of the design dimension represented by the corresponding connected second pairs of the vertices. Information about the design dimension is extracted from one or more source databases to generate the weighted property graph data model.

20 Claims, 16 Drawing Sheets

(51) Int. Cl.
*G06F 16/26* (2019.01)
*G06F 16/21* (2019.01)
*G06F 16/25* (2019.01)
*G06F 16/185* (2019.01)
*G06F 17/50* (2006.01)
*G06F 16/20* (2019.01)

(52) U.S. Cl.
CPC .......... *G06F 16/212* (2019.01); *G06F 16/254* (2019.01); *G06F 16/26* (2019.01); *G06F 16/285* (2019.01); *G06F 17/50* (2013.01)

(58) Field of Classification Search
CPC ............... G06F 16/185; G06F 17/5068; G06F 17/30958; G06F 17/30404; G06F 17/50; G06F 8/34; G06F 8/10; G06F 19/26; G06F 3/04847; G06T 11/206; H04L 63/1425
See application file for complete search history.

(56) References Cited

U.S. PATENT DOCUMENTS

| | | | |
|---|---|---|---|
| 5,987,240 | A | 11/1999 | Kay |
| 6,781,599 | B2 | 8/2004 | Abello et al. |
| 7,058,623 | B2 | 6/2006 | Wong |
| 8,396,823 | B2 | 3/2013 | Akatsu |
| 8,396,884 | B2 | 3/2013 | Singh et al. |
| 8,499,284 | B2 | 7/2013 | Pich et al. |
| 8,676,866 | B2 | 3/2014 | Lemcke et al. |
| 8,719,754 | B1 | 5/2014 | Ginetti |
| 8,860,727 | B2 | 10/2014 | Beers et al. |
| 8,868,446 | B2 | 10/2014 | Lamoureux et al. |
| 8,898,197 | B2 | 11/2014 | Senjalia |
| 8,903,762 | B2 | 12/2014 | Jin et al. |
| 9,002,898 | B2 | 4/2015 | Narayanan et al. |
| 9,031,994 | B1 | 5/2015 | Cao et al. |
| 9,134,976 | B1 | 9/2015 | Ezick et al. |
| 9,262,776 | B2 | 2/2016 | Lamoureux et al. |
| 10,121,000 | B1 | 11/2018 | Rivlin et al. |
| 10,263,848 | B2* | 4/2019 | Wolting ................ H04L 41/145 |
| 2002/0087275 | A1* | 7/2002 | Kim ........................ G16B 45/00 702/19 |
| 2005/0132320 | A1* | 6/2005 | Allen .................. G06F 17/5068 716/103 |
| 2007/0168533 | A1 | 7/2007 | Canright et al. |
| 2010/0332444 | A1* | 12/2010 | Akatsu ................ G06F 17/5095 706/54 |
| 2011/0234594 | A1 | 9/2011 | Charles et al. |
| 2012/0001916 | A1 | 1/2012 | Majors et al. |
| 2012/0284384 | A1 | 11/2012 | Shi et al. |
| 2014/0019490 | A1* | 1/2014 | Roy .................... G06F 16/2228 707/798 |
| 2014/0059089 | A1 | 2/2014 | Bryden |
| 2014/0317019 | A1 | 10/2014 | Papenbrock et al. |
| 2015/0039652 | A1 | 2/2015 | Kapoustin |
| 2015/0120717 | A1 | 4/2015 | Kim et al. |
| 2015/0188751 | A1 | 7/2015 | Vasseur et al. |
| 2016/0063081 | A1* | 3/2016 | Rudolf .................. G06F 16/254 707/602 |
| 2016/0110434 | A1* | 4/2016 | Kakaraddi .......... G06F 16/9024 707/602 |
| 2016/0275168 | A1 | 9/2016 | Nemery et al. |
| 2016/0283650 | A1 | 9/2016 | Jacunski et al. |
| 2017/0090807 | A1 | 3/2017 | Gupta et al. |
| 2017/0092143 | A1 | 3/2017 | Brennan et al. |
| 2017/0147705 | A1* | 5/2017 | Kasperovics ....... G06F 16/2433 |
| 2017/0185910 | A1 | 6/2017 | Appel et al. |
| 2017/0193016 | A1* | 7/2017 | Kulkarni ............... G06F 16/288 |
| 2017/0251013 | A1 | 8/2017 | Kirti et al. |
| 2018/0018402 | A1* | 1/2018 | Vogler ................ G06F 16/9024 |
| 2018/0103052 | A1* | 4/2018 | Choudhury ........... G06F 21/566 |
| 2018/0173763 | A1 | 6/2018 | Xia et al. |
| 2018/0268076 | A1 | 9/2018 | Gianetto et al. |
| 2018/0268078 | A1 | 9/2018 | Gianetto et al. |
| 2018/0270259 | A1 | 9/2018 | Gianetto et al. |

FOREIGN PATENT DOCUMENTS

| | | |
|---|---|---|
| WO | 2018170097 | 9/2018 |
| WO | 2018170101 | 9/2018 |
| WO | 2018170108 | 9/2018 |
| WO | 2018170112 | 9/2018 |

OTHER PUBLICATIONS

"International Application Serial No. PCT US2018 022386, International Search Report dated May 11, 2018", 4 pgs.
"International Application Serial No. PCT US2018 022386, Written Opinion dated May 11, 2018", 10 pgs.
"Community Structure in Social and Biological Networks", 11 pgs.
"Girvan-Newman algorithm—Wikipedia", Retrieved from the Internet: <https://en.wikipedia.0rg/w/index.php?title=Girvan-Newman algorithm&oldid=676937350>, (Aug. 20, 2015), 2 pgs.
"International Application Serial No. PCT/US2018/022392, International Search Report dated Jun. 13, 2018", 5 pgs.
"International Application Serial No. PCT/US2018/022392, Written Opinion dated Jun. 13, 2018", 6 pgs.
"International Application Serial No. PCT/US2018/022402, International Search Report dated May 22, 2018", 4 pgs.
"International Application Serial No. PCT/US2018/022402, Written Opinion dated May 22, 2018", 9 pgs.
"International Application Serial No. PCT/US2018/022407, International Search Report dated May 23, 2018", 4 pgs.
"International Application Serial No. PCT/US2018/022407, Written Opinion dated May 23, 2018", 9 pgs.
"3D CAD Design Software | Solidworks", Dassault Systems, [Online]. Retrieved from the Internet: <URL: http://www.solidworks.com/>, (Accessed Mar. 17, 2017), 2 pgs.
"CORE 9: Product Design and Development Success Through Integrated Systems Engineering", Vitech Corporation, [Online]. Retrieved from the Internet: <URL: http://www.vitechcorp.com/products/CORE.shtml>, (Accessed Mar. 17, 2017), 4 pgs.
"Creo Schematics", PTC, [Online]. Retrieved from the Internet: <URL: http://www.ptc.com/cad/creo/schematics>, (Accessed Mar. 17, 2017), 2 pgs.
"Creo® PTC", PTC, [Online]. Retrieved from the Internet: <URL: http://www.ptc.com/cad/creo>, (Accessed Mar. 17, 2017), 3 pgs.
"Graph Databases Use Cases", neo technology: graphs are everywhere, (May 21, 2014), 86 pgs.
"IBM® RATIONAL® RHAPSODY® Designer for Systems Engineers", IBM®, [Online]. Retrieved from the Internet: <URL:http://www-03.ibm.com/software/products/en/ratirhapdesiforsystengi>, (Accessed Mar. 17, 2017), 3 pgs.
"Magic Draw", No Magic, Inc., [Online]. Retrieved from the Internet: <URL: https://www.nomagic.com/products/magicdraw, (Accessed Mar. 17, 2017), 4 pgs.
Albert, Reka, et al., "Error and attack tolerance of complex networks", Nature | vol. 406. © 2000 Macmillan Magazines Ltd, (Jul. 2000), 378-381.
Bader, David, et al., "Applications and challenges in large-scale graph analysis", Georgia Tech, Computational Science and Engineering, (2013), 1-20.
Baker, Frank, "Stability of Two Hierarchical Grouping Techniques Case : Sensitivity to Data Errors", Journal of the American Statistical Association vol. 69, No. 346 Theory and Methods Section, (Jun. 1974,), 440-445.
Barrat, Alain, et al., "Resilience and Robustness of Networks", Dynamical Processes on Complex Networks, Cambridge University Press, (2008), 116-123.
Browning, Tyson, "Applying the Design Structure Matrix to System Decomposition and Integration Problems: A Review and New Directions", IEEE Transactions on Engineering Management, vol. 48, No. 3, (Aug. 2001), 292-306.

(56) References Cited

OTHER PUBLICATIONS

Bulac, Aydin, et al., "Deployed Large-Scale Graph Analytics: Use Cases, Target Audiences, and Knowledge Discovery Toolbox (KDT) Technology", SlidePlayer.com Inc., (2011), 57 pgs.
Clauset, Aaron, et al., "Finding community structure in very large networks", Phys. Rev. E 70, 066111, (2004), 6 pgs.
Ferreira, Laura, et al., "A Comparison of Hierarchiacal Methods for Clustering Functional Data", Communications in Statistics—Simulation and Computation, (2009), 1-31.
Fowlkes, E B, et al., "A Method for Comparing Two Hierarchical Clusterings", Journal of the American Statistical Association, vol. 78, No. 383, (Sep. 1983), 553-569.
Garrett, Robert, Jr., "A Graph-Based Metamodel for Enabling System of Systems Engineering", Missile Defense Agency COS MDIOC-730 337 1. Approved for Public Release 14-MDA-7691, (Feb. 19, 2014), 1-18.
Girvan, M, et al., "Community structure in social and biological networks", PNAS, vol. 99, No. 12, [Online]. Retrieved from the Internet: <URL: www.pnas.org/cgi/doi/10.1073/pnas.122653799>, (Jun. 11, 2002), 7821-7826.
Kasthurirathna, Dharshana, et al., "On the influence of topological characteristics on robustness of complex networks", Centre for Complex Systems Research Faculty of Engineering and IT The University of Sydney NSW, (Feb. 27, 2014), 1-16.
Roth, J, et al., "Algorithms in graph theory and their use for solving problems design", Computer-aided Design, vol. 20, No. 7, (Sep. 1988), 373-381.
Shai, O, et al., "Graph theory representations of engineering systems and their embedded knowledge", Artificial Intelligence in Engineering 13, (1999), 273-285.
Sokal, Robert, et al., "The Comparison of Dendrograms by Objective Methods", Taxon, vol. 11, No. 2, (Feb. 1962), 33-40.
Tran, Trung, "Hierarchical Identify Verify Exploit (HIVE)", DARPA/MTO. Proposers Day Brief DARPA-BAA-16-52, (2016), 13 pgs.
Wagner, Silke, et al., "Comparing Clusterings—An Overview", (Jan. 12, 2007), 1-19.
U.S. Appl. No. 15/460,443, filed Mar. 16, 2017, Systems and Methods for Generating a Property Graph Data Model Representing a System Architecture.
U.S. Appl. No. 15/460,457, filed Mar. 16, 2017, Quantifying Consistency of a System Architecture by Comparing Analyses of Property Graph Data Models Representing Different Versions of the System Architecture.
U.S. Appl. No. 15/460,462, filed Mar. 16, 2017, Quantifying Robustness of a System Architecture by Analyzing a Property Graph Data Model Representing the System Architecture.
"U.S. Appl. No. 15/460,443, Examiner Interview Summary dated Apr. 23, 2019", 3 pgs.
"U.S. Appl. No. 15/460,457, Non Final Office Action dated Mar. 20, 2019", 37 pgs.
"U.S. Appl. No. 15/460,462, Non Final Office Action dated Mar. 29, 2019", 35 pgs.

\* cited by examiner

SYSTEMS AND METHODS FOR GENERATING A WEIGHTED PROPERTY GRAPH DATA MODEL REPRESENTING A SYSTEM ARCHITECTURE

TECHNICAL FIELD

Embodiments generally relate to system architecture models, and more particularly to systems and methods for generating a weighted property graph data model representing a system architecture.

BACKGROUND

When developing a system architecture, data regarding the physical hierarchy and information exchange interfaces of the system facilitate an understanding of the system architecture. There are many different tools used to design and develop different aspects of a system architecture, so the data regarding the physical hierarchy and information exchange interfaces of the system are typically dispersed among these various disparate tools in a variety of different forms. These tools may be utilized by various domains that contribute to the architecture development, yet utilize different languages and standards in their software packages to allow development by the domain they are intended to serve. Some examples include system and software modeling tools, for example, IBM® RATIONAL® RHAPSODY® DESIGNER FOR SYSTEMS ENGINEERS, No Magic, Inc.'s MAGICDRAW, Vitech Corporation's CORE™; or mechanical and electrical design tools, for example, PTC's CREO®, DASSAULT SYSTEMES' SOLIDWORKS, PTC's CREO SCHEMATIC™, and others. Computational analyses are typically performed on various aspects of the system design, but not the overall system architecture. An overall analysis of the system architecture typically involves manual modeling and analysis by an expert, preparation of a report, and peer requirements reviews and design reviews.

DETAILED DESCRIPTION

Figure 1:
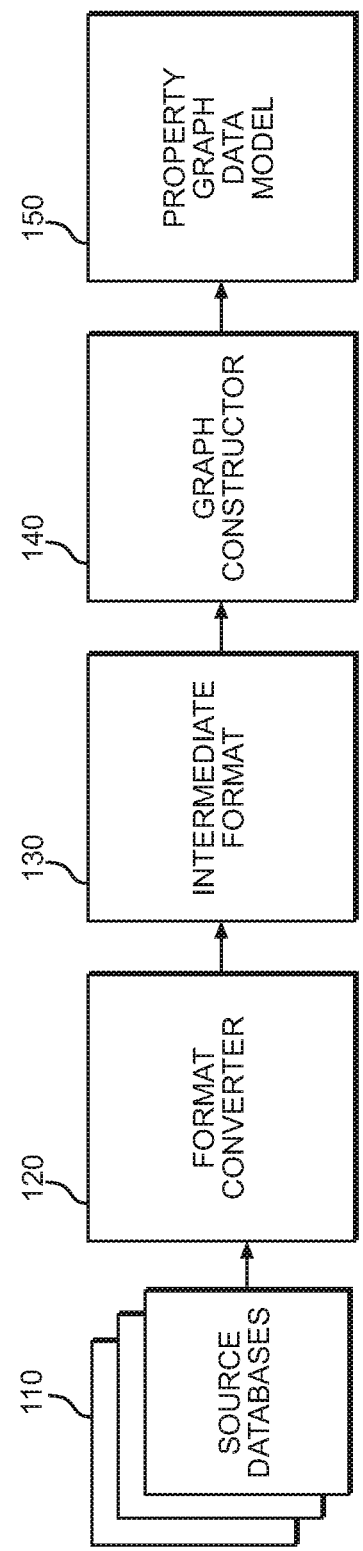
FIG. 1 is a block diagram that illustrates a data flow for generation of a property graph data model representing a system architecture, in accordance with some embodiments.

The following description and the drawings sufficiently illustrate specific embodiments to enable those skilled in the art to practice them. Other embodiments may incorporate physical, functional, logical, electrical, process, cost, and other changes. Portions and features of some embodiments may be included in, or substituted for, those of other embodiments. Embodiments set forth in the claims encompass all available equivalents of those claims.

A property graph data model representing a system architecture may facilitate analyses of whole digital system models (DSMs), regardless of their complexity. The property graph data model may be generated based on a variety of different databases and data files representing different aspects, characteristics, and design dimensions of the system architecture. These different databases and data files may be generated by various different software tools. While the large volume of data pertaining to the system architecture in these different databases may be too vast, too detailed, and too disconnected to be make sense of directly, the property graph data model generated by formalizing this large volume of data into a consistent, unified representation may be computationally analyzed to glean information about the system architecture that may otherwise not be known from its disconnected toolsets and databases. The property graph data model may be a single hierarchical representation that is computationally analyzable and scalable across various system architecture sizes and hierarchies from a small system architecture, e.g., a sensor, to a large computer system, computer communications network, aerospace system, military defense system, etc.

The property graph data model may be considered a mathematic representation of a system architecture design. System analyses performed with data stored in the property graph data model may execute much faster than with data stored in a relational database management system (RDMS), because the property graph data model is much more efficient with storing and accessing intricate, complex relationships with multiple connections. The property graph data model may also be extended to incorporate not only a self-consistent description of the system architecture design, but also information pertaining to production, testing, performance, reliability, faults, failures, and costs of the system architecture, as well as other characteristics and aspects. The property graph data model may capture and specify the relationships between the different aspects, characteristics, and design dimensions of the system architecture. These relationships may then be computationally analyzed using various analysis methods to obtain information about the quality, modularity, maturity, robustness, resiliency, reliability, and fragility of the system architecture, as well as how well the physical system architecture aligns with the functional system architecture.

The property graph data model may be transformed into a weighted part-to-part coupling graph to facilitate various types of analyses using graph algorithms that are applicable for property graph analysis in general. The weighted part-to-part coupling graph data model may be an embodiment of the property graph data model. In the weighted part-to-part coupling graph, the hierarchy of parts as constructed in the property graph data model may be supplemented with weighted interface edges connecting different parts according to the connections between parts in the property graph data model established by an interface design dimension and a variety of factors, for example, the number or frequency of connections between parts, complexity of the interfaces between parts, a number of signals included in the interface between parts, and costs or defects associated with the connected parts. The weighting factors may be adjusted according to the application at hand and the analyses that are to be performed using the part-to-part coupling graph.

Using the part-to-part coupling graph, a consistency between the hierarchal decomposition of the physical system and the system's information exchange interfaces as an embodiment of the functional architecture may be analyzed by computationally creating clusters of parts based on physical decomposition connections and information exchange connections and comparing them. Previously, typical analysis techniques were largely manual endeavors by subject-matter experts that reviewed system diagrams and reports on system architecture and design, and design reviews by skilled practitioners. These manual endeavors were subjective, and therefore also lacked consistency and repeatability. The manual endeavors also lacked the robustness to detect gaps or discontinuities between different viewpoints and toolsets in order to achieve a consistent architecture description for the system. There was a reliance on individual software design, modeling, and simulation tools at a detailed design level for various aspects of the system design, e.g., design and performance of individual parts of the design, but such software tools did not include an ability to quantify a consistency of a system architecture design by comparing the information exchange interfaces between parts with the physical hierarchy or breakdown of the parts in the system architecture.

FIG. 1 is a block diagram that illustrates a data flow for generation of a property graph data model 150 representing a system architecture, in accordance with some embodiments. A system architecture may be designed using a variety of tools, e.g., software applications for design, modeling and/or simulation of various aspects of the system architecture. Thus, various portions of the system architecture may be represented in different databases having different structures and stored in various data files having different file formats. These various different databases may be source databases 110 from which relevant characteristics pertaining to a system architecture may be accessed for generating a single unified property graph data model 150 that represents the entire system architecture for purposes of system-level analysis, evaluation, and design. The relevant characteristics pertaining to the system architecture included in the source databases 110 may include information pertaining to the design, modeling, simulation, manufacture, operation, testing, performance, reliability, faults, failure, cost, and evaluation of a system architecture.

The source databases 110 may include information pertaining to many dimensions of the system architecture, for example, various parts included in the system architecture, information exchange interfaces between the various parts, information items exchanged between the parts through these interfaces, signals used to communicate the information items exchanged between the parts through the interfaces, functions performed by the parts, and system requirements or functional requirements for the various parts or functions performed by the various parts. The source databases 110 may include, for example, data files describing netlists for integrated circuits, printed circuit boards, and field programmable gate arrays (FPGAs), hardware description language models of the system architecture, etc.

Each dimension of the system architecture may also be represented at different levels of a hierarchy. For example, parts of the system architecture may be represented at a high level of the hierarchy as modules, e.g., a computing rack. At the next lowest level of the hierarchy, the computing rack may be broken down into multiple blades that plug into the computing rack, where each of the blades may include a computing processor or other device, e.g., a network router, a network file storage controller, etc. At the next lowest level of the hierarchy, each of the blades may be broken down into various cards that plug into the blade. At the next lowest level of the hierarchy, the various cards may be broken down into individual electronic parts that are attached to the card, e.g., packaged semiconductor chips that are soldered onto the card.

A format converter 120 may read data from the source databases 110, select appropriate data to be used for system architecture analyses and to be included in the property graph data model 150, and output the selected data to be stored in an intermediate format 130. The format converter 120 may select and formalize data from the source databases 110 that are appropriate for analyzing one or more particular aspects of the system architecture. The intermediate format 130 may include an internal data structure stored in memory or a data file stored in a storage device such as a hard disk drive or a flash drive. The intermediate format 130 may have a consistent format regardless of the characteristics of the system architecture, the various tools used to represent various aspects of the system architecture, and the various formats and characteristics of the source databases 110. The intermediate format 130 may bridge a gap between a high level of a system architecture and a detailed design of the system architecture. The intermediate format 130 may include one or more files.

A graph constructor 140 may read the data stored in the intermediate format 130 and formalize the system architecture into a graph by constructing the property graph 150 to hierarchically represent the system architecture according to a graph schema as described elsewhere herein. The graph constructor 140 may be consistent for use for all types of system architectures, regardless of the characteristics of the system architecture, the various tools used to represent various aspects of the system architecture, and the various formats and characteristics of the source databases 110. The property graph data model 150 may provide a physical and functional view of the system architecture design. The property graph data model 150 may facilitate various types of analyses of the system architecture, for example, quality of the system architecture, modularity of the system architecture, maturity of the system architecture, robustness of the system architecture, reliability of the system architecture, fragility of the system architecture, and comparisons of these analyses between different system architectures to understand relative rankings of different designs based on these quantitative analyses.

Figure 2:
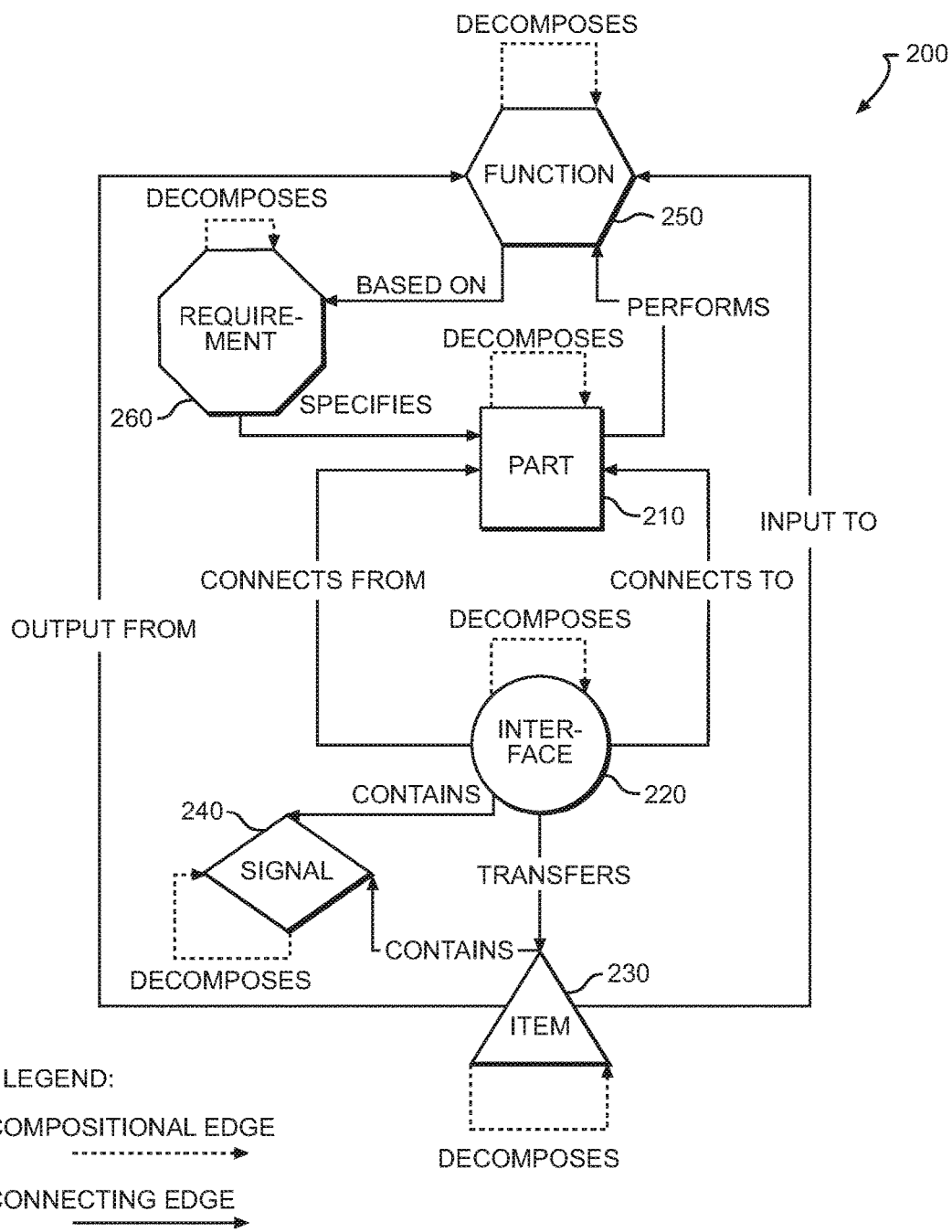
FIG. 2 is a block diagram that illustrates a graph schema, in accordance with some embodiments.

FIG. 2 is a block diagram that illustrates a graph schema 200, in accordance with some embodiments. The graph schema 200 may be common across all the tools used in association with the source databases 110 of FIG. 1, and may therefore be considered tool-independent. The graph schema 200 represents relationships between different hierarchies of various design dimensions and different elements of the various design dimensions at different levels of hierarchy.

The graph schema 200 includes two essential elements: vertices (illustrated as various shapes, including squares, circles, triangles, diamonds, hexagons, and octogons), and edges (illustrated as solid and broken lines). The vertices may represent a class of design dimension, e.g., a part 210, an interface 220, an information item 230, a signal 240, a function 250, and a requirement 260. While certain example design dimensions are represented by the illustrated vertices, this should not be construed as limiting, as more or fewer design dimensions may be represented in any specific embodiment of the graph schema 200. For example, in various embodiments, the graph schema 200 may only include design dimensions represented by vertices for part 210 and interface 220. In various embodiments, design dimensions for operations performed on parts during manufacture may also be represented in the graph schema 200. In various embodiments, a design dimension for serial numbers built from parts within the design may also be represented in the graph schema 200. In various embodiments, design dimensions for defects discovered in serial numbers by manufacturing operations may also be represented in the graph schema 200.

Compositional edges (illustrated as broken lines) may represent directional-decomposition (e.g., in the direction of the arrow) or directional-composition (e.g., opposite the direction of the arrow) of the class of design dimension represented by a vertex from one level of a hierarchy to another level of the hierarchy. Directional-decomposition of a design dimension represented by a vertex may decompose the vertex at a higher hierarchical level into a plurality of vertexes at a lower hierarchical level, and directional-composition of a design dimension represented by the vertex may compose a single vertex at the higher hierarchical level from a plurality of vertexes at the lower hierarchical level.

Connecting edges (illustrated as solid lines) may represent connections or relationships between different design dimensions (illustrated as vertices) of the system architecture. The directionality of the arrows of the connecting edges shown in FIG. 2 represent the directions of definition for the graph schema 200, not necessarily the direction of data flow of a system architecture represented by the graph schema 200. As illustrated, the interface 220 may connect to the part 210 and may connect from the part 210. This represents the relationship that parts 210 may be connected to one another via information exchange interfaces 220. Taken together, the connects-to and connects-from relationship pair embodies the direction of data flow from part to part. Bidirectional interfaces may be represented by connects-to and connects-from connecting edges directed to both endpoints on the information exchange interface. In various levels of a hierarchy, the interface 220 may include a wiring harness, individual wires of the wiring harness, and communication protocols used to communicate via the individual wires of the wiring harness. For example, a high level interface might be a wiring harness, while low level interface might be an Ethernet communication interface. Interfaces 220 that are hierarchical integrations of other interfaces 220 may connect to and connect from parts 210 regardless of where the interface 220 is located in its compositional hierarchy; however, to reduce graph data model ambiguity, care may be taken when constructing the property graph data model 150 in accordance with the graph schema 200 to ensure that part end points are consistent across the interface hierarchy by restricting the connects-to and connects-from connecting edges to only those interface vertices that are leaf nodes in their respective composition/decomposition hierarchy.

As illustrated, the interface 220 contains signals 240. This represents the relationship that various signals 240 may be communicated between the parts 210 across the interfaces 220. The signals 240 represented at different levels of the hierarchy may be connected to different hierarchical levels of the interface 220. Examples of signals 240 include a power voltage, a power ground, an electrical signal waveform, an optical signal, etc. As also illustrated, the interface 220 may transfer information items 230, and the information items 230 may contain signals 240. This represents that information items 230, e.g., data, may be transferred across the interface 220 between different parts 210. The information items 230 may also be represented at different hierarchical levels, and the information items 230 at different hierarchical levels may contain signals 240 at different hierarchical levels. Examples of high-level information items may include a packet definition for a communication protocol, and examples of low-level information items may include a bit field within a packet. The information items 230 may be output from or input to functions 250. The functions 250 may be performed by the parts 210. The functions 250 may also be based on requirements 260. The requirements 260 may specify the parts 210 in the system architecture, for non-functional requirements. In general, any hierarchical level of a vertex representing one design dimension may connect to any hierarchical level of one or more other vertices representing different design dimensions by connecting edges representing relationships between the different design dimensions.

Figure 3:
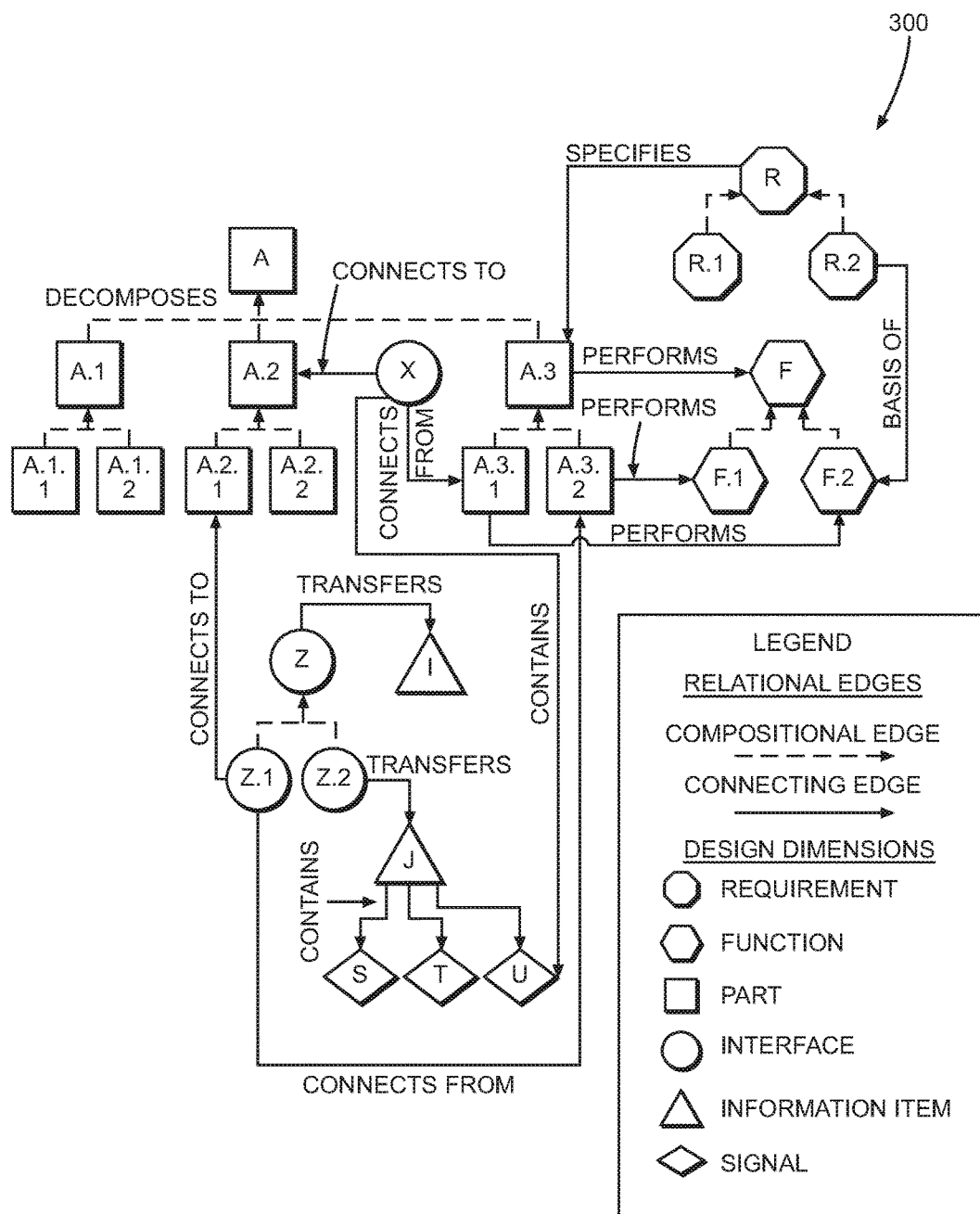
FIG. 3 is a block diagram that illustrates a property graph according to the graph schema of FIG. 2, in accordance with some embodiments.

The graph schema 200 may be used within graph constructor 140 (see FIG. 4) logic to construct property graphs conforming to the graph schema 200, for example, property graph 300 in FIG. 3, which embodies requirement, function, part, interface, item, and signal vertex classes as well as compositional and connecting edges.

The graph schema 200 may also be related to the information included in the intermediate format 130 of FIG. 1, and how that intermediate format 130 is structured. For example, a product hierarchy file may include one row for each unique part in the system architecture, a column for the part name, and one column each for a parent and child hierarchical part name. An interface file may include one row for each unique interface in the system architecture, and a column for each of a name of the interface, part names that the interface connects to and connects from, the direction of information flow on the interface, and a column for an electrical harness from which the interface is decomposed. A signal file may include one row for each unique signal (e.g., electrical signal) in the system architecture, and a column for each of a name of the signal, a name of an interface or information item that the contains the signal, a class name of the design dimension that the signal has a relationship with (e.g., interface or information item), and one column each for a parent and child hierarchical signal name. An information item file may include one row for each unique information item in the system architecture, and a column for each of a name of the information item, an interface name that transfer the information item or a signal name that contains the information item, a class name of the design dimension that the information item has a relationship with (e.g., interface or signal), and one column each for a parent and child hierarchical information item name. The intermediate format 130 may include more or fewer files than discussed herein, and information relating to each class of design dimension may be included together in a same data file or in a memory.

FIG. 3 is a block diagram that illustrates an exemplary property graph 300 according to the graph schema 200 of FIG. 2, in accordance with some embodiments. A part A is at the highest hierarchical level of the property graph 300, and decomposes into parts A.1, A.2, and A.3 at a second hierarchical level lower than the highest hierarchical level. The part A.1 decomposes into parts A.1.1 and A.1.2 at a third hierarchical level, the part A.2 decomposes into parts A.2.1 and A.2.2 at the third hierarchical level, and the part A.3 decomposes into parts A.3.1 and A.3.2 at the third hierarchical level. An interface X connects from the part A.3.1 at the third hierarchical level and connects to the part A.2 at the second hierarchical level. The interface X contains a signal U. The signal U is contained by an information item J, along with signals S and T. An interface Z transfers an information item I, and the interface Z decomposes into interfaces Z.1 and Z.2 at a lower hierarchical level. The interface Z.1 connects from the part A.3.2 and connects to the part A.2.1. The interface Z.2 transfers the information item J that contains the signals S, T, and U. The part A.3 performs a function F. The function F decomposes into functions F.1 and F.2. The part A.3.2 performs function F.1, while the part A.3.1 performs the function F.2. A requirement R specifies the part A.3. The requirement R decomposes into requirements R.1 and R.2. The function F.2 is performed on the basis of the requirement R.2.

Various computational network analyses may be performed using the property graph data model 300 to determine various metrics regarding the system architecture. These various analysis methods may obtain information about the quality, modularity, maturity, robustness, resiliency, reliability, and fragility of the system architecture, as well as how well the physical system architecture aligns with the functional system architecture. Various other potential analyses producing various other results and information may also be performed using the property graph data model 300.

Figure 4:
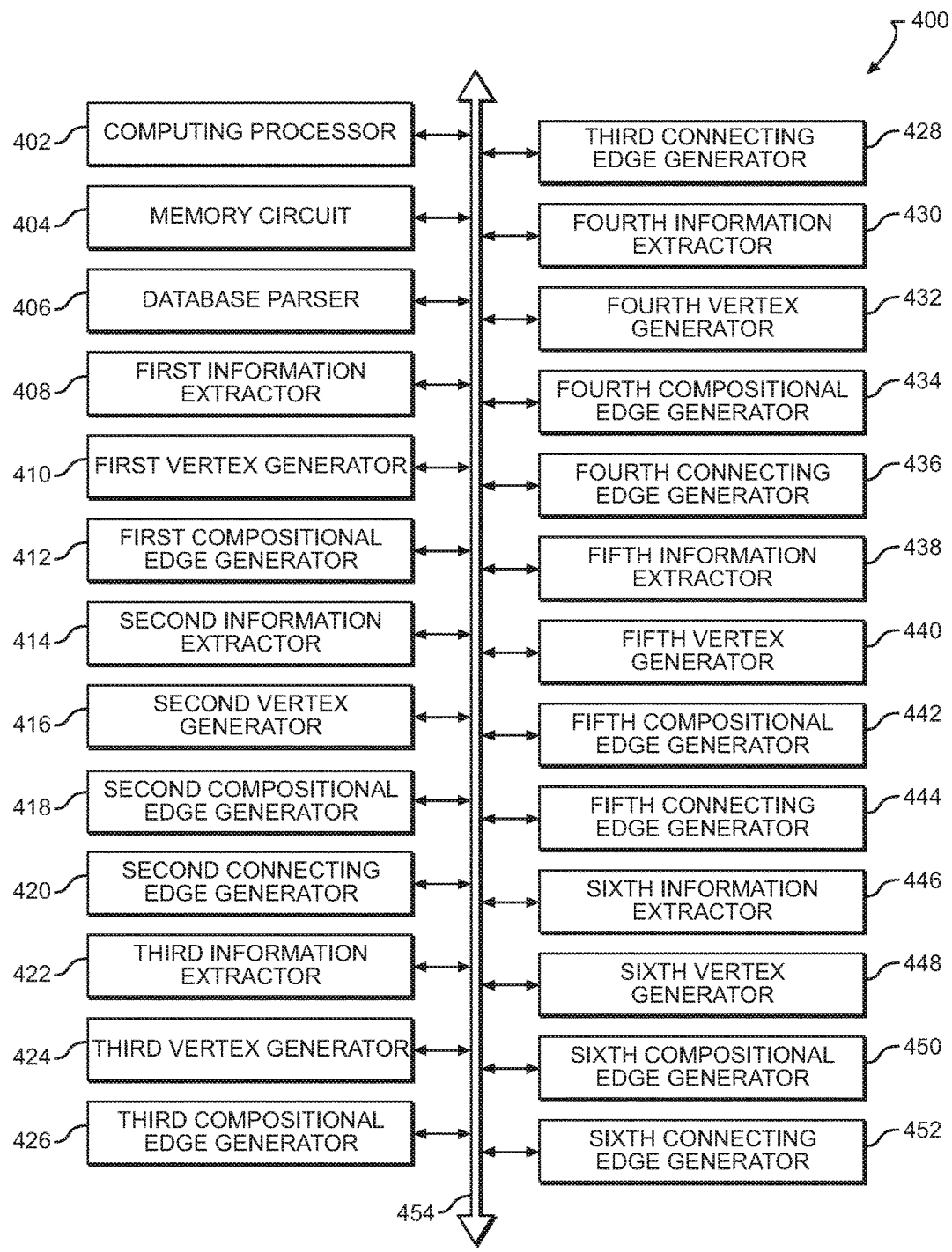
FIG. 4 is a block diagram that illustrates a system for generating a property graph, in accordance with some embodiments.

FIG. 4 is a block diagram that illustrates a system 400 for generating a property graph, in accordance with some embodiments. An example property graph 300 that may be generated by the system 400 is illustrated in FIG. 3. The system 400 may include a computing processor 402 and a memory circuit 404 that may store a data structure operated on by the computing processor 402, e.g., a data structure based on the graph schema 200 that represents the property graph 300. The memory circuit 404 may also store a program that when executed by the computing processor 402 performs the method 500 of FIG. 5. The elements of the system 400 may communicate with one another via one or more connections or data buses 454.

A property graph may be an embodiment of a property graph data model, e.g., the property graph data model 150 of FIG. 1, that includes a plurality of vertices, a plurality of compositional edges, and a plurality of connecting edges in a data structure. The plurality of compositional edges may represent directed-composition and directed-decomposition within a vertex type, and the plurality of connecting edges may represent connections between one vertex type and another vertex type.

A database parser 406 may access one or more source databases, e.g., source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in the memory circuit 404. The database parser 406 may include dedicated circuitry or logic that is permanently configured, e.g., as a special-purpose processor, such as an FPGA or an application-specific integrated circuit (ASIC), or programmable logic or circuitry, e.g., the computing processor 402 that performs operations according to instructions stored in the memory circuit 404.

A first information extractor 408 extract information pertaining to a plurality of first instances of a first design dimension of the system architecture from the one or more source databases. The first information extractor 408 may be included in an embodiment of the format converter 120 of FIG. 1. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board which the plurality of integrated circuit parts are mounted, so the circuit card part would be at a higher level of the parts hierarchy than the plurality of integrated circuit parts and the circuit board part on which the plurality of integrated circuit parts are mounted. The first information extractor 408 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A first vertex generator 410 may generate a first vertex in the property graph data model for each first instance of the plurality of first instances. The first vertex may represent the first instance. The first vertex generator 410 may be included in an embodiment of the graph constructor 140 of FIG. 1. The first vertex generator 410 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A first compositional edge generator 412 may generate a first compositional edge in the property graph data model for one or more first instances of the plurality of first instances. The first compositional edge may be connected to two different first vertices. The first compositional edge may represent a hierarchical directed-composition or directed-decomposition of the first instance with respect to another first instance of the plurality of first instances. The first compositional edge generator 412 may be included in an embodiment of the graph constructor 140 of FIG. 1. The first compositional edge generator 412 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A second information extractor 414 may extract information from the one or more source databases pertaining to a plurality of second instances of a second design dimension of the system architecture. The second information extractor 414 may be included in an embodiment of the format converter 120 of FIG. 1. The second design dimension may be an interface hierarchy between the plurality of parts of the system architecture. The plurality of second instances may be a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections. The second information extractor 414 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A second vertex generator 416 may generate a second vertex in the property graph data model for each second instance of the plurality of second instances. The second vertex may represent the second instance. The second vertex generator 416 may be included in an embodiment of the graph constructor 140 of FIG. 1. The second vertex generator 416 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A second compositional edge generator 418 may generate a second compositional edge in the property graph data model, for one or more second instances of the plurality of second instances. The second compositional edge may be connected to two different second vertices. The second compositional edge may represent a hierarchical directed-composition or directed-decomposition of the second instance with respect to another second instance of the plurality of second instances. The second compositional edge generator 418 may be included in an embodiment of the graph constructor 140 of FIG. 1. The second compositional edge generator 418 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A second connecting edge generator 420 may generate a second connecting edge in the property graph data model, for one or more second instances of the plurality of second instances. The second connecting edge may represent a connection between the second instance and a first instance of the plurality of first instances. The second connecting edge may represent that an interface represented by a second instance connected to one end of the second connecting edge is connected for the purpose of information exchange to a part represented by a first instance connected to the other end of the second connecting edge. The second connecting edge generator 420 may be included in an embodiment of the graph constructor 140 of FIG. 1. The second connecting edge generator 420 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A third information extractor 422 may extract information pertaining to a plurality of third instances of a third design dimension of the system architecture from the one or more source databases. The third information extractor 422 may be included in an embodiment of the format converter 120 of FIG. 1. The third design dimension may be an information item hierarchy. The plurality of third instances may be a plurality of information items transferred via the plurality of interfaces of the system architecture. Some of the information items may be integrations of others of the information items, and therefore the information items that are integrations of others of the information items may be at a higher level of the hierarchy of information items than the others of the information items. Examples of the hierarchy of information items may be represented by the information item 230 in the graph schema 200 and the information items I and J of FIG. 3. The third information extractor 422 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A third vertex generator 424 may generate a third vertex in the property graph data model for each third instance of the plurality of third instances. The third vertex may represent the third instance. The third vertex generator 424 may be included in an embodiment of the graph constructor 140 of FIG. 1. The third vertex generator 424 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A third compositional edge generator 426 may generate a third compositional edge in the property graph data model for one or more third instances of the plurality of third instances. The third compositional edge may be connected to two different third vertices. The third compositional edge may represent a hierarchical directed-composition or directed-decomposition of one third instance with respect to another third instance of the plurality of third instances. The third compositional edge generator 426 may be included in an embodiment of the graph constructor 140 of FIG. 1. The third compositional edge generator 426 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A third connecting edge generator 428 may generate a third connecting edge in the property graph data model, for one or more third instances of the plurality of third instances. The third connecting edge may represent a connection between the third instance and a first instance of the plurality of first instances or a second instance of the plurality of second instances. The third connecting edge may represent that an information item represented by a third instance connected to one end of the third connecting edge is connected to an interface represented by a second instance connected to the other end of the third connecting edge, designating that the information item is transferred by the interface. The third connecting edge generator 428 may be included in an embodiment of the graph constructor 140 of FIG. 1. The third connecting edge generator 428 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fourth information extractor 430 may extract information pertaining to a plurality of fourth instances of a fourth design dimension of the system architecture from the one or more source databases. The fourth information extractor 430 may be included in an embodiment of the format converter 120 of FIG. 1. The fourth design dimension may be a function hierarchy. The plurality of fourth instances may be a plurality of functions performed by the plurality of parts of the system architecture. Some of the functions may be integrations of others of the functions, and therefore the functions that are integrations of others of the functions may be at a higher level of the hierarchy of functions than the others of the functions. Examples of the hierarchy of functions may be represented by the function 250 in the graph schema 200 and the functions F, F.1, and F.2 of FIG. 3. The fourth information extractor 430 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fourth vertex generator 432 may generate a fourth vertex in the property graph data model for each fourth instance of the plurality of fourth instances. The fourth vertex may represent the fourth instance. The fourth vertex generator 432 may be included in an embodiment of the graph constructor 140 of FIG. 1. The fourth vertex generator 432 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fourth compositional edge generator 434 may generate a fourth compositional edge in the property graph data model for one or more fourth instances of the plurality of fourth instances. The fourth compositional edge may be connected to two different fourth vertices. The fourth compositional edge may represent a hierarchical directed-composition or directed-decomposition of one fourth instance with respect to another fourth instance of the plurality of fourth instances. The fourth compositional edge generator 434 may be included in an embodiment of the graph constructor 140 of FIG. 1. The fourth compositional edge generator 434 may include dedicated circuitry or logic that is permanently configured, e.g., as a special-purpose processor, such as an FPGA or an ASIC, or programmable logic or circuitry, the computing processor 402 that performs operations according to instructions stored in the memory circuit 404.

A fourth connecting edge generator 436 may generate a fourth connecting edge in the property graph data model, for one or more fourth instances of the plurality of fourth instances. The fourth connecting edge may represent a connection between the fourth instance and a first instance of the plurality of first instances, a second instance of the plurality of second instances, or a third instance of the plurality of third instances. The fourth connecting edge may represent that a function represented by a fourth instance connected to one end of the fourth connecting edge is connected to a part represented by a first instance connected to the other end of the fourth connecting edge, designating that the function is performed by the part. The fourth connecting edge may represent that a function represented by a fourth instance connected to one end of the fourth connecting edge is connected to an information item represented by a third instance connected to the other end of the fourth connecting edge, designating that the information item is input to the function or the information item is output from the function. The fourth connecting edge generator 436 may be included in an embodiment of the graph constructor 140 of FIG. 1. The fourth connecting edge generator 436 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fifth information extractor 438 may extract information pertaining to a plurality of fifth instances of a fifth design dimension of the system architecture from the one or more source databases. The fifth information extractor 438 may be included in an embodiment of the format converter 120 of FIG. 1. The fifth design dimension may be a function hierarchy. The plurality of fifth instances may be a plurality of requirements based on the plurality of functions performed by the plurality of parts of the system architecture. Some of the requirements may be integrations of others of the requirements, and therefore the requirements that are integrations of others of the requirements may be at a higher level of the hierarchy of requirements than the others of the requirements. Examples of the hierarchy of requirements may be represented by the requirement 260 in the graph schema 200 and the requirements R, R.1, and R.2 of FIG. 3.

A fifth vertex generator 440 may generate a fifth vertex in the property graph data model for each fifth instance of the plurality of fifth instances. The fifth vertex may represent the fifth instance. The fifth vertex generator 440 may be included in an embodiment of the graph constructor 140 of FIG. 1. The fifth vertex generator 440 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fifth compositional edge generator 442 may generate a fifth compositional edge in the property graph data model for one or more fifth instances of the plurality of fifth instances. The fifth compositional edge may be connected to two different fifth vertices. The fifth compositional edge may represent a hierarchical directed-composition or directed-decomposition of one fifth instance with respect to another fifth instance of the plurality of fifth instances. The fifth compositional edge generator 442 may be included in an embodiment of the graph constructor 140 of FIG. 1. The fifth compositional edge generator 442 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A fifth connecting edge generator 444 may generate a fifth connecting edge in the property graph data model, for one or more fifth instances of the plurality of fifth instances. The fifth connecting edge may represent a connection between the fifth instance and a first instance of the plurality of first instances, a second instance of the plurality of second instances, a third instance of the plurality of third instances, or a fourth instance of the plurality of fourth instances. The fifth connecting edge may represent that a requirement represented by a fifth instance connected to one end of the fifth connecting edge is connected to a function represented by a fourth instance connected to the other end of the fifth connecting edge, designating that the function is based on the requirement. The fifth connecting edge may represent that a requirement represented by a fifth instance connected to one end of the fifth connecting edge is connected to a part represented by a first instance connected to the other end of the fifth connecting edge, designating that the part is based on the requirement. The fifth connecting edge generator 444 may be included in an embodiment of the graph constructor 140 of FIG. 1. The fifth connecting edge generator 444 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A sixth information extractor 446 may extract information pertaining to a plurality of sixth instances of a sixth design dimension of the system architecture from the one or more source databases. The sixth information extractor 446 may be included in an embodiment of the format converter 120 of FIG. 1. The sixth design dimension may be a signal hierarchy. The plurality of sixth instances may be a plurality of signals communicated via the plurality of interfaces between the plurality of parts of the system architecture or communicating at least one information item of the plurality of information items of the system architecture. Some of the signals may be integrations of others of the signals, and therefore the signals that are integrations of others of the signals may be at a higher level of the hierarchy of signals than the others of the signals. Examples of the hierarchy of signals may be represented by the signal 240 in the graph schema 200 and the signals S, T, and U of FIG. 3. The fifth connecting edge generator 444 may be included in an embodiment of the graph constructor 140 of FIG. 1. The sixth information extractor 446 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A sixth vertex generator 448 may generate a sixth vertex in the property graph data model for each sixth instance of the plurality of sixth instances. The sixth vertex may represent the sixth instance. The sixth vertex generator 448 may be included in an embodiment of the graph constructor 140 of FIG. 1. The sixth vertex generator 448 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A sixth compositional edge generator 450 may generate a sixth compositional edge in the property graph data model for one or more sixth instances of the plurality of sixth instances. The sixth compositional edge may be connected to two different sixth vertices. The sixth compositional edge may represent a hierarchical directed-composition or directed-decomposition of one sixth instance with respect to another sixth instance of the plurality of sixth instances. The sixth compositional edge generator 450 may be included in an embodiment of the graph constructor 140 of FIG. 1. The sixth compositional edge generator 450 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

A sixth connecting edge generator 452 may generate a sixth connecting edge in the property graph data model, for one or more sixth instances of the plurality of sixth instances. The sixth connecting edge may represent a connection between the sixth instance and a first instance of the plurality of first instances, a second instance of the plurality of second instances, a third instance of the plurality of third instances, a fourth instance of the plurality of fourth instances, or a fifth instance of the plurality of fifth instances. The sixth connecting edge may represent that a signal represented by a sixth instance connected to one end of the sixth connecting edge is connected to an interface represented by a second instance connected to the other end of the sixth connecting edge, designating that the signal is included in the interface. The sixth connecting edge may represent that a signal represented by a sixth instance connected to one end of the sixth connecting edge is connected to an information item represented by a third instance connected to the other end of the sixth connecting edge, designating that the signal is included in the information item. The sixth connecting edge generator 452 may be included in an embodiment of the graph constructor 140 of FIG. 1. The sixth connecting edge generator 452 may include dedicated circuitry or logic that is permanently configured, e.g., as a special-purpose processor, such as an FPGA or an ASIC, or programmable logic or circuitry, e.g., the computing processor 402 that performs operations according to instructions stored in the memory circuit 404.

Figure 5:
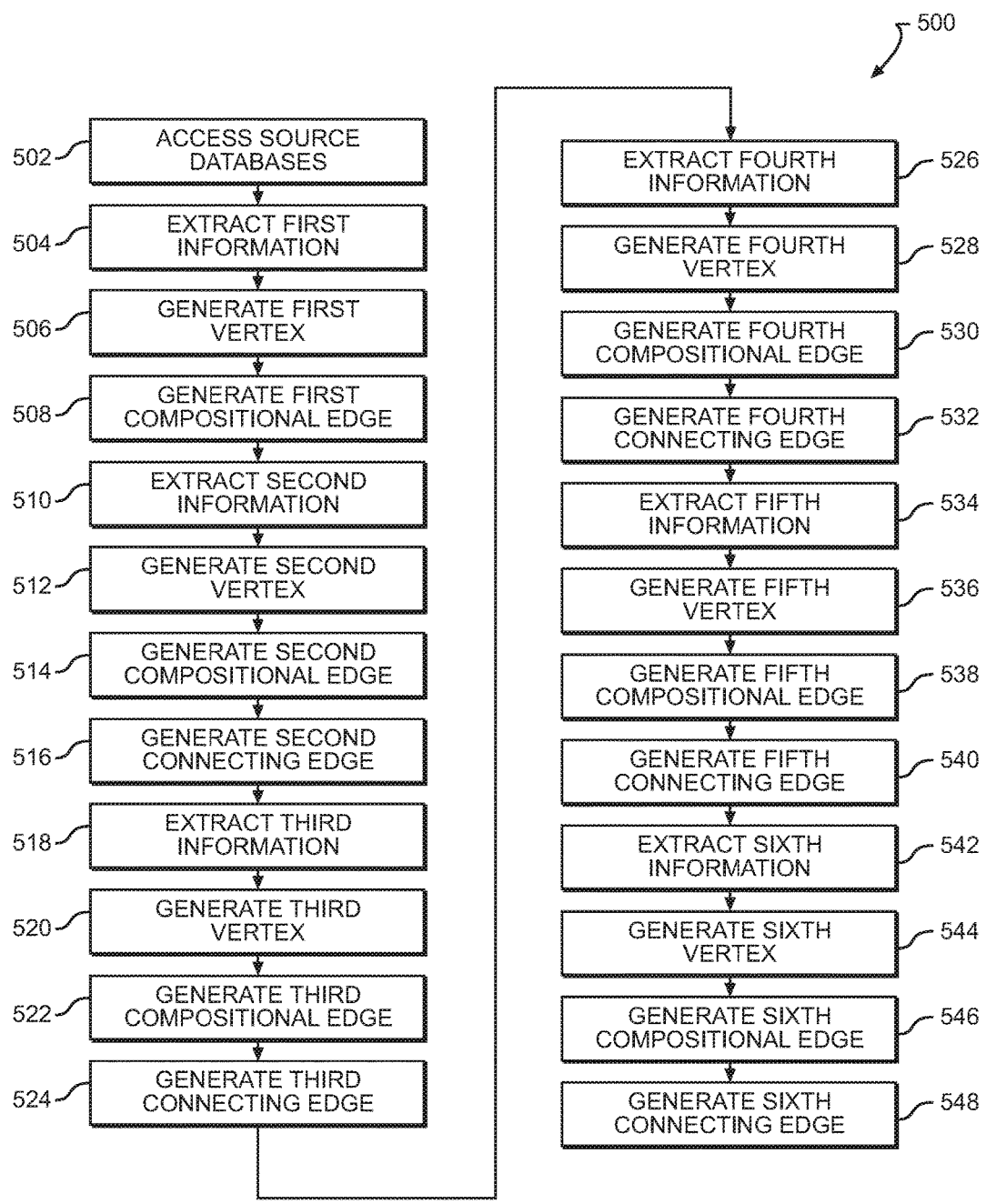
FIG. 5 is a block diagram that illustrates a method of generating a property graph, in accordance with some embodiments.

FIG. 5 is a block diagram that illustrates a method 500 of generating a property graph, in accordance with some embodiments. The method 500 may be performed by the system 400 of FIG. 4. FIG. 3 illustrates an example property graph 300 that may be generated by the method 500. The property graph may be an embodiment of a property graph data model, e.g., the property graph data model 150 of FIG. 1, that includes a plurality of vertices, a plurality of compositional edges, and a plurality of connecting edges in a data structure. The plurality of compositional edges may represent directed-composition and directed-decomposition within a vertex type, and the plurality of connecting edges may represent connections between one vertex type and another vertex type. The data structure may be stored in a memory circuit (e.g., the memory circuit 404) of a computer system having a computing processor (e.g., the computing processor 402).

In an operation 502, one or more source databases, such as source databases 110 of FIG. 1, may be accessed by the computing processor. The operation 502 may be performed by the database parser 406 of FIG. 4. The source databases may include relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in a memory circuit of the computer system, e.g., the memory circuit 404.

In an operation 504, information pertaining to a plurality of first instances of a first design dimension of the system architecture may be extracted from the one or more source databases. The operation 504 may be performed by the first information extractor 408 of FIG. 4 or an embodiment of the format converter 120 of FIG. 1. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted.

In an operation 506, for each first instance of the plurality of first instances, a first vertex may be generated in the property graph data model. The operation 506 may be performed by the first vertex generator 410 of FIG. 4 or an embodiment of the graph constructor 140 of FIG. 1. The first vertex may represent the first instance.

In an operation 508, for one or more first instances of the plurality of first instances, a first compositional edge may be generated in the property graph data model. The operation 508 may be performed by the first compositional edge generator 412 of FIG. 4 or an embodiment of the graph constructor 140 of FIG. 1. The first compositional edge may be connected to two different first vertices. The first compositional edge may represent a hierarchical directed-composition or directed-decomposition of one first instance with respect to another first instance of the plurality of first instances.

In an operation 510, information pertaining to a plurality of second instances of a second design dimension of the system architecture may be extracted from the one or more source databases. The operation 510 may be performed by the second information extractor 414 of FIG. 4 or an embodiment of the format converter 120 of FIG. 1. The second design dimension may be an interface hierarchy between the plurality of parts of the system architecture. The plurality of second instances may be a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections.

In an operation 512, for each second instance of the plurality of second instances, a second vertex may be generated in the property graph data model. The operation 512 may be performed by the second vertex generator 416 of FIG. 4 or an embodiment of the graph constructor 140 of FIG. 1. The second vertex may represent the second instance.

In an operation 514, for one or more second instances of the plurality of second instances, a second compositional edge may be generated in the property graph data model. The operation 514 may be performed by the second compositional edge generator 418 of FIG. 4 or an embodiment of the graph constructor 140 of FIG. 1. The second compositional edge may be connected to two different second vertices. The second compositional edge may represent a hierarchical directed-composition or directed-decomposition of one second instance with respect to another second instance of the plurality of second instances.

In an operation 516, for one or more second instances of the plurality of second instances, a second connecting edge may be generated in the property graph data model. The operation 516 may be performed by the second connecting edge generator 420 of FIG. 4 or an embodiment of the graph constructor 140 of FIG. 1. The second connecting edge may represent a connection between the second instance and a first instance of the plurality of first instances. The second connecting edge may represent that an interface represented by a second instance connected to one end of the second connecting edge is connected for the purpose of information exchange to a part represented by a first instance connected to the other end of the second connecting edge.

In an operation 518, information pertaining to a plurality of third instances of a third design dimension of the system architecture may be extracted from the one or more source databases. The operation 518 may be performed by the third information extractor 422 of FIG. 4 or an embodiment of the format converter 120 of FIG. 1. The third design dimension may be an information item hierarchy. The plurality of third instances may be a plurality of information items transferred via the plurality of interfaces of the system architecture. Some of the information items may be integrations of others of the information items, and therefore the information items that are integrations of others of the information items may be at a higher level of the hierarchy of information items than the others of the information items.

In an operation 520, for each third instance of the plurality of third instances, a third vertex may be generated in the property graph data model. The operation 520 may be performed by the third vertex generator 424 of FIG. 4 or an embodiment of the graph constructor 140 of FIG. 1. The third vertex may represent the third instance.

In an operation 522, for one or more third instances of the plurality of third instances, a third compositional edge may be generated in the property graph data model. The operation 522 may be performed by the third compositional edge generator 426 of FIG. 4 or an embodiment of the graph constructor 140 of FIG. 1. The third compositional edge may be connected to two different third vertices. The third compositional edge may represent a hierarchical directed-composition or directed-decomposition of one third instance with respect to another third instance of the plurality of third instances.

In an operation 524, for one or more third instances of the plurality of third instances, a third connecting edge may be generated in the property graph data model. The operation 524 may be performed by the third connecting edge generator 428 of FIG. 4 or an embodiment of the graph constructor 140 of FIG. 1. The third connecting edge may represent a connection between the third instance and a first instance of the plurality of first instances or a second instance of the plurality of second instances. The third connecting edge may represent that an information item represented by a third instance connected to one end of the third connecting edge is connected to an interface represented by a second instance connected to the other end of the third connecting edge, designating that the information item is transferred by the interface.

In an operation 526, information pertaining to a plurality of fourth instances of a fourth design dimension of the system architecture may be extracted from the one or more source databases. The operation 526 may be performed by the fourth information extractor 430 of FIG. 4 or an embodiment of the format converter 120 of FIG. 1. The fourth design dimension may be a function hierarchy. The plurality of fourth instances may be a plurality of functions performed by the plurality of parts of the system architecture. Some of the functions may be integrations of others of the functions, and therefore the functions that are integrations of others of the functions may be at a higher level of the hierarchy of functions than the others of the functions.

In an operation 528, for each fourth instance of the plurality of fourth instances, a fourth vertex may be generated in the property graph data model. The operation 528 may be performed by the fourth vertex generator 432 of FIG. 4 or an embodiment of the graph constructor 140 of FIG. 1. The fourth vertex may represent the fourth instance.

In an operation 530, for one or more fourth instances of the plurality of fourth instances, a fourth compositional edge may be generated in the property graph data model. The operation 530 may be performed by the fourth compositional edge generator 434 of FIG. 4 or an embodiment of the graph constructor 140 of FIG. 1. The fourth compositional edge may be connected to two different fourth vertices. The fourth compositional edge may represent a hierarchical directed-composition or directed-decomposition of one fourth instance with respect to another fourth instance of the plurality of fourth instances.

In an operation 532, for one or more fourth instances of the plurality of fourth instances, a fourth connecting edge may be generated in the property graph data model. The operation 532 may be performed by the fourth connecting edge generator 436 of FIG. 4 or an embodiment of the graph constructor 140 of FIG. 1. The fourth connecting edge may represent a connection between the fourth instance and a first instance of the plurality of first instances, a second instance of the plurality of second instances, or a third instance of the plurality of third instances. The fourth connecting edge may represent that a function represented by a fourth instance connected to one end of the fourth connecting edge is connected to a part represented by a first instance connected to the other end of the fourth connecting edge, designating that the function is performed by the part. The fourth connecting edge may represent that a function represented by a fourth instance connected to one end of the fourth connecting edge is connected to an information item represented by a third instance connected to the other end of the fourth connecting edge, designating that the information item is input to the function or the information item is output from the function.

In an operation 534, information pertaining to a plurality of fifth instances of a fifth design dimension of the system architecture may be extracted from the one or more source databases. The operation 534 may be performed by the fifth information extractor 438 of FIG. 4 or an embodiment of the format converter 120 of FIG. 1. The fifth design dimension may be a function hierarchy. The plurality of fifth instances may be a plurality of requirements based on the plurality of functions performed by the plurality of parts of the system architecture. Some of the requirements may be integrations of others of the requirements, and therefore the requirements that are integrations of others of the requirements may be at a higher level of the hierarchy of requirements than the others of the requirements.

In an operation 536, for each fifth instance of the plurality of fifth instances, a fifth vertex may be generated in the property graph data model. The operation 536 may be performed by the fifth vertex generator 440 of FIG. 4 or an embodiment of the graph constructor 140 of FIG. 1. The fifth vertex may represent the fifth instance.

In an operation 538, for one or more fifth instances of the plurality of fifth instances, a fifth compositional edge may be generated in the property graph data model. The operation 538 may be performed by the fifth compositional edge generator 442 of FIG. 4 or an embodiment of the graph constructor 140 of FIG. 1. The fifth compositional edge may be connected to two different fifth vertices. The fifth compositional edge may represent a hierarchical directed-composition or directed-decomposition of one fifth instance with respect to another fifth instance of the plurality of fifth instances.

In an operation 540, for one or more fifth instances of the plurality of fifth instances, a fifth connecting edge may be generated in the property graph data model. The operation 540 may be performed by the fifth connecting edge generator 444 of FIG. 4 or an embodiment of the graph constructor 140 of FIG. 1. The fifth connecting edge may represent a connection between the fifth instance and a first instance of the plurality of first instances, a second instance of the plurality of second instances, a third instance of the plurality of third instances, or a fourth instance of the plurality of fourth instances. The fifth connecting edge may represent that a requirement represented by a fifth instance connected to one end of the fifth connecting edge is connected to a function represented by a fourth instance connected to the other end of the fifth connecting edge, designating that the function is based on the requirement. The fifth connecting edge may represent that a requirement represented by a fifth instance connected to one end of the fifth connecting edge is connected to a part represented by a first instance connected to the other end of the fifth connecting edge, designating that the part is based on the requirement.

In an operation 542, information pertaining to a plurality of sixth instances of a sixth design dimension of the system architecture may be extracted from the one or more source databases. The operation 542 may be performed by the sixth information extractor 446 of FIG. 4 or an embodiment of the format converter 120 of FIG. 1. The sixth design dimension may be a signal hierarchy. The plurality of sixth instances may be a plurality of signals communicated via the plurality of interfaces between the plurality of parts of the system architecture or communicating at least one information item of the plurality of information items of the system architecture. Some of the signals may be integrations of others of the signals, and therefore the signals that are integrations of others of the signals may be at a higher level of the hierarchy of signals than the others of the signals.

In an operation 544, for each sixth instance of the plurality of sixth instances, a sixth vertex may be generated in the property graph data model. The operation 544 may be performed by the sixth vertex generator 448 of FIG. 4 or an embodiment of the graph constructor 140 of FIG. 1. The sixth vertex may represent the sixth instance.

In an operation 546, for one or more sixth instances of the plurality of sixth instances, a sixth compositional edge may be generated in the property graph data model. The operation 546 may be performed by the sixth compositional edge generator 450 of FIG. 4 or an embodiment of the graph constructor 140 of FIG. 1. The sixth compositional edge may be connected to two different sixth vertices. The sixth compositional edge may represent a hierarchical directed-composition or directed-decomposition of one sixth instance with respect to another sixth instance of the plurality of sixth instances.

In an operation 548, for one or more sixth instances of the plurality of sixth instances, a sixth connecting edge may be generated in the property graph data model. The operation 548 may be performed by the sixth connecting edge generator 452 of FIG. 4 or an embodiment of the graph constructor 140 of FIG. 1. The sixth connecting edge may represent a connection between the sixth instance and a first instance of the plurality of first instances, a second instance of the plurality of second instances, a third instance of the plurality of third instances, a fourth instance of the plurality of fourth instances, or a fifth instance of the plurality of fifth instances. The sixth connecting edge may represent that a signal represented by a sixth instance connected to one end of the sixth connecting edge is connected to an interface represented by a second instance connected to the other end of the sixth connecting edge, designating that the signal is included in the interface. The sixth connecting edge may represent that a signal represented by a sixth instance connected to one end of the sixth connecting edge is connected to an information item represented by a third instance connected to the other end of the sixth connecting edge, designating that the signal is included in the information item.

In various embodiments, there may be any number of different vertex types representing different design dimensions, and any of the different vertex types may have connecting edges to any of the other different vertex types. Any vertex may have one or more connecting edges connected to it, and each of the one or more connecting edges may connect to any other vertex of another vertex type within connection rules defined within the graph schema 200 (see FIG. 2). Each connecting edge represents a relationship between the different vertexes that are connected by the connecting edge. In some embodiments, the connecting edges are directional. In some embodiments, the connecting edges are not directional.

Figure 6:
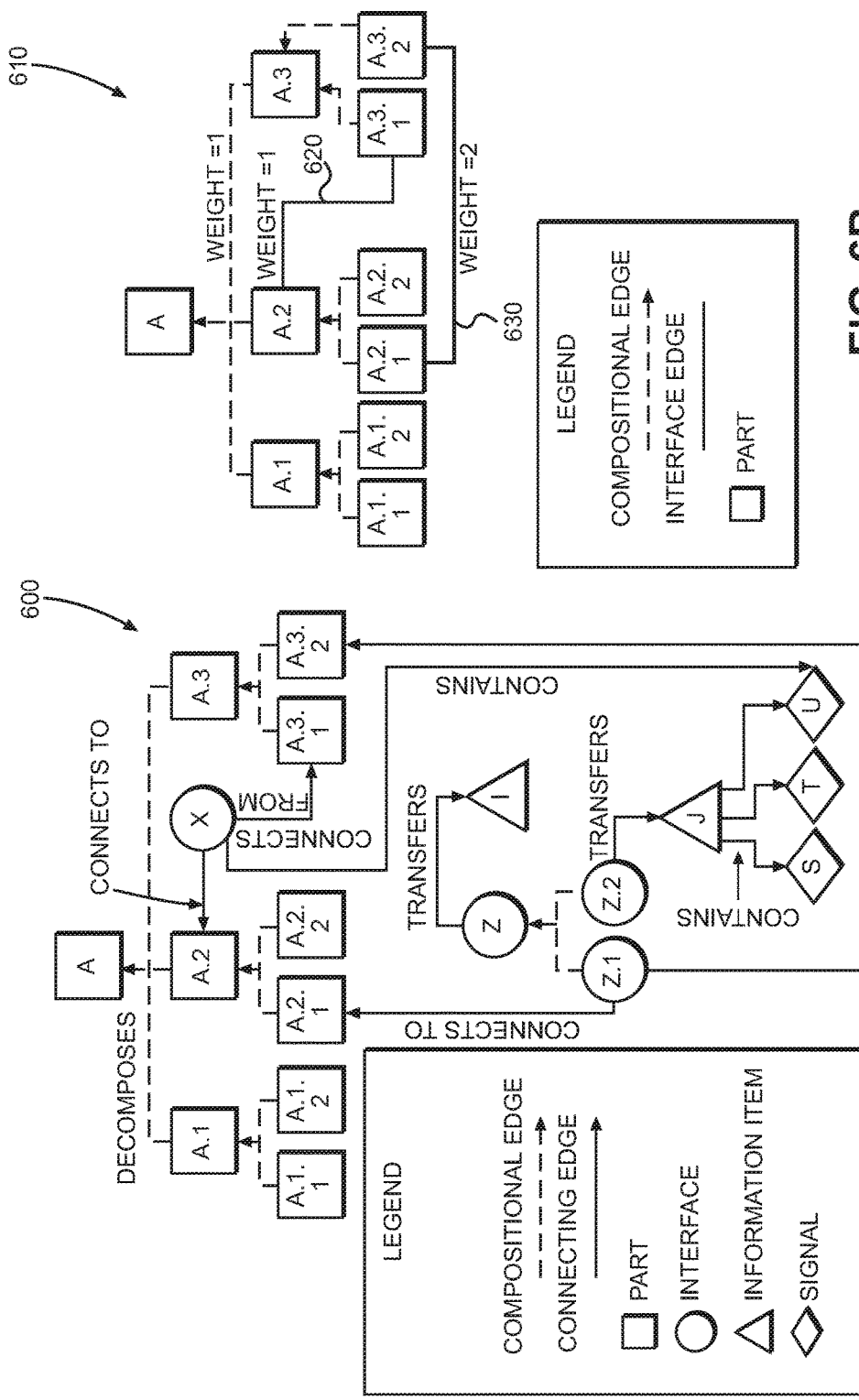
FIGS. 6A and 6B are block diagrams that illustrate generating a weighted part-to-part coupling graph based on a property graph, in accordance with some embodiments.

FIGS. 6A and 6B are block diagrams that illustrate generating a weighted part-to-part, coupling graph based on a property graph, in accordance with some embodiments. FIG. 6A illustrates an exemplary hierarchical property graph data model 600 of a system architecture similar to the exemplary hierarchical property graph data model 300 illustrated in FIG. 3, except that the hierarchical property graph data model 600 does not include the functions F, F.1, F.2, the requirements R, R.1, R.2, and their associated compositional edges and connecting edges. A new weighted part-to-part coupling graph 610 as illustrated in FIG. 6B may be generated based on the property graph data model 600 by copying the parts hierarchy of the property graph data model 600 while ignoring any design dimensions except for parts and interfaces, and converting the interfaces of the hierarchical property graph data model 600 into weighted interface edges between the relevant parts in the weighted part-to-part coupling graph 610. This may be referred to as a one-mode bipartite projection of a two-mode version of the property graph data model 600, that contains interface and part vertex classes and their respective interface edges, into the weighted part-to-part coupling graph 610. In some embodiments, the weighted part-to-part coupling graph 610 may be generated directly from the source databases 110 of FIG. 1 without the intermediate step of creating the property graph data model. For example, the graph constructor 140 of FIG. 1 may directly generate the weighted part-to-part coupling graph 610.

In an embodiment, the weights of the compositional edges of the weighted part-to-part coupling graph 610 are set to a value of 1, and the weights of the interface edges 620, 630 are determined according to the following formula: weight= $(1+\alpha)\times\beta$, where $\alpha$ is a relative interface complexity factor ranging from 0.0 for minimum complexity to 1.0 for maximum complexity, and $\beta$ is an architecture importance factor ranging from 1.0 for a hardware/software combined architecture and >1.0 for a software architecture. The architecture importance factor $\beta$ may provide for cross-domain scalability (e.g., software vs. hardware design). For example, the variable $\beta$ may represent the importance of information exchange interfaces relative to a physical decomposition, and the relative complexity factor $\alpha$ may be determined by how many signals are transferred via an interface represented by the respective interface edge. As illustrated, the weight of interface edge 620 is 1, because the relative complexity factor $\alpha$ of the interface between parts A.2 and A.3.1 is 0, and the architecture importance factor $\beta$ for this hardware/software architecture is 1. The weight of interface edge 630 is 2, because the relative complexity factor $\alpha$ of the interface between parts A.2 and A.3.1 is 1, and the architecture importance factor $\beta$ for this hardware/software architecture is 1.

In an embodiment, a connectivity weighting or graph degree approach may be used to assign weights to the interface edges representing interfaces between parts in the weighted part-to-part coupling graph. Each part may have a cost that is divided by the number of compositional and interface connections that it has and that divided cost may be used to determine a weighting of the attached interface edges. In this embodiment, the weights of the interface edges 620, 630 may be determined according to the following formula: the integration and test cost estimate of the first of the pair of parts which the interface edge (e.g., one of interface edge 620 or interface edge 630) is coupled with divided by a total number of edges (all incoming edges, including compositional and interface edges) connected to the first of the pair of parts plus the integration and test cost estimate of the second of the pair of parts which the interface edge (e.g., the other of interface edge 620 or interface edge 630) is coupled with divided by a total number of edges connected to the second of the pair of parts. Each part in the weighted part-to-part coupling graph 610 may have a cost assigned to it, which may be based upon the time required to integrate and test the part or the number of parts at a lower hierarchical level that integrate into the part. By this metric, the part A.2 may have a higher cost than the part A.3.1, for example. The part A.2 has a total of 3 incoming and interface edges connected to it, whereas the part A.3.1 has just one interface edge connected to it. In this embodiment, if the part A.2 were to be assigned a cost of 3 and the part A.3.1 were to be assigned a cost of 1, the weight of the interface edge 620 would be 1, which embodies the average cost of integrating the interface. Likewise, if the part A.2.1 were to be assigned a cost of 1 and the part A.3.2 were to be assigned a cost of 1 in this embodiment, the weight of the interface edge 630 would be 1.

Various types of computational analyses can be performed based on the weighted part-to-part coupling graph 610. These may include evaluations of modularity, system architecture internal consistency, robustness, and fragility. For example, by progressively removing interface edges from the property graph data model 610, the fragility and robustness of a system architecture may be determined.

Figure 7:
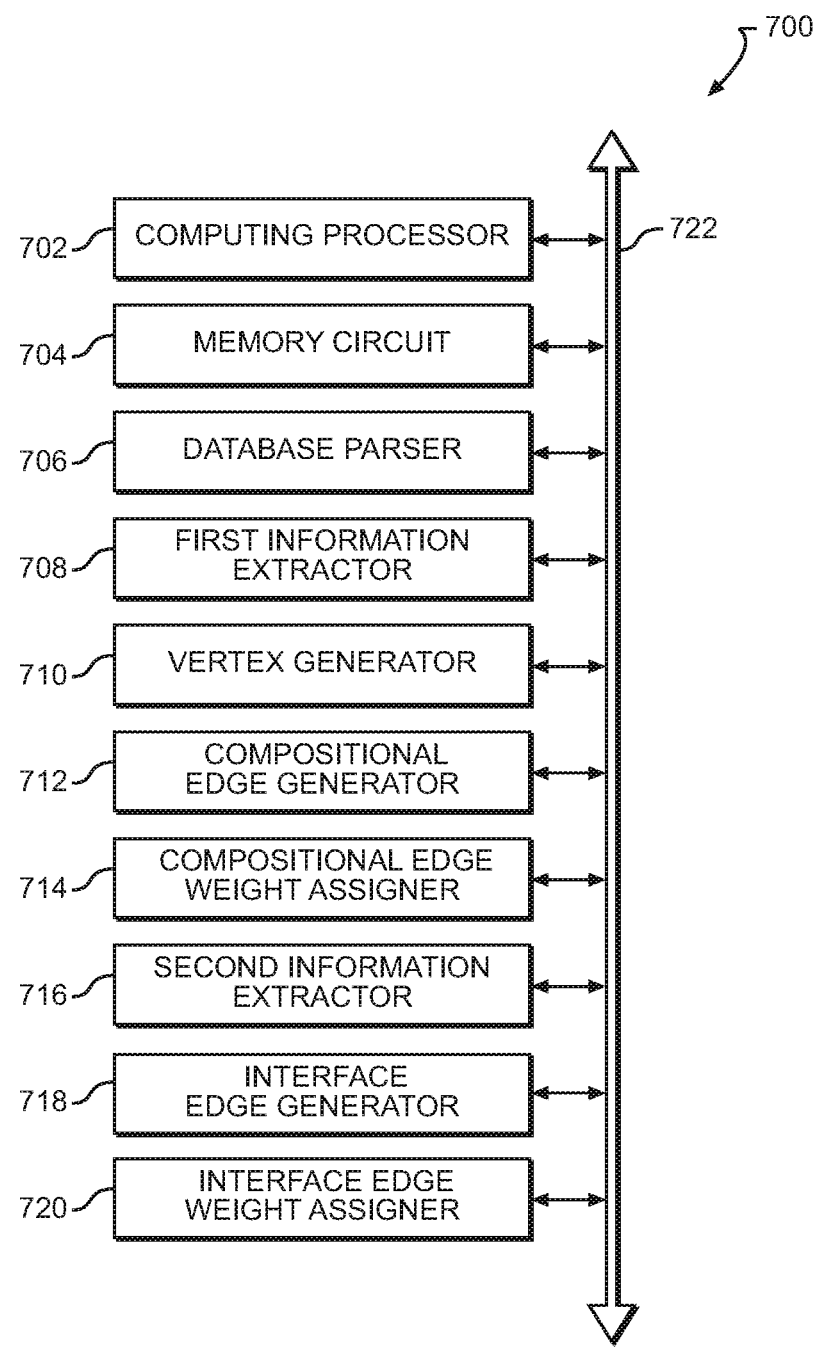
FIG. 7 is a block diagram that illustrates a system for generating a weighted part-to-part coupling graph, in accordance with some embodiments.

FIG. 7 is a block diagram that illustrates a system 700 for generating a weighted part-to-part coupling graph, in accordance with some embodiments. FIG. 6B illustrates an exemplary weighted part-to-part coupling graph 610 that may be generated by the system 700. The system 700 may include a computing processor 702 and a memory circuit 704 that may store a data structure operated on by the computing processor 702, e.g., a data structure based on the graph schema 200 that represents the property graph 300. The memory circuit 704 may also store a program that when executed performs the method 800 of FIG. 8. The elements of the system 700 may communicate with one another via one or more connections or data buses 722.

A weighted part-to-part coupling graph may be an embodiment of a weighted part-to-part coupling graph data model that includes a plurality of vertices, a plurality of compositional edges, and a plurality of interface edges in a data structure. The plurality of weighted compositional edges may represent directed-composition and directed-decomposition within a vertex type, and the plurality of interface edges may represent information exchange interfaces between vertices. The data structure may be stored in a memory circuit, e.g., the memory circuit 704, of a computer system having a computing processor, e.g., the computing processor 702.

A database parser 706 may access one or more source databases, e.g., source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in the memory circuit 704, for example, a data structure including a property graph data model generated according to the method 500 described with reference to FIG. 5. The database parser 706 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

A first information extractor 708 may extract information pertaining to a plurality of first instances of a first design dimension of the system architecture from the one or more source databases. The first design dimension may be a parts hierarchy of the system architecture. The first information extractor 708 may include an embodiment of the first information extractor 408 of FIG. 4, or may be included in an embodiment of the format converter 120 of FIG. 1. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted. The first information extractor 708 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

A vertex generator 710 may generate a plurality of vertices in the property graph data model. Each of the plurality of vertices may represent one first instance of the plurality of first instances. Each of the plurality of vertices may represent one part of the plurality of parts. The vertex generator 710 may be included in an embodiment of the graph constructor 140 of FIG. 1. The vertex generator 710 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

A compositional edge generator 712 may generate a plurality of weighted compositional edges in the part-to-part coupling graph data model. Each of the plurality of weighted compositional edges may connect a different pair of vertices of the plurality of vertices. Each of the plurality of weighted compositional edges may represent a hierarchical directed-composition or directed-decomposition of one first instance of the plurality of first instances with respect to another first instance of the plurality of first instances. The compositional edge generator 712 may be included in an embodiment of the graph constructor 140 of FIG. 1. The compositional edge generator 712 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704. The plurality of weighted compositional edges may represent physical integration of the parts of the parts hierarchy of the system architecture.

A compositional edge weight assigner 714 may assign a compositional weight value to each of the plurality of weighted compositional edges, for example, representing the complexity and/or cost of integration of the lower-level part into the higher-level part. The compositional edge weight assigner 714 may be included in an embodiment of the graph constructor 140 of FIG. 1. The compositional edge weight assigner 714 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704. In an embodiment, each of the plurality of weighted compositional edges may be assigned a weight value of one.

A second information extractor 716 may extract information from the one or more source databases pertaining to a plurality of second instances of a second design dimension of the system architecture. The second design dimension may be an interface hierarchy between the plurality of parts of the system architecture. The second information extractor 716 may include an embodiment of the second information extractor 414 of FIG. 4 or may be included in an embodiment of the format converter 120 of FIG. 1. The interface hierarchy may include a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections. The second information extractor 716 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

An interface edge generator 718 may generate a plurality of weighted interface edges. Each of the plurality of weighted interface edges may connect a different pair of vertices of the plurality of vertices and represent an information exchange connection between a corresponding pair of first instances of the plurality of first instances according to one or more second instances of the plurality of second instances. The plurality of weighted interface edges may represent information exchange connections between pairs of parts of the parts hierarchy of the system architecture. The interface edge generator 718 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

An interface edge weight assigner 720 may assign an interface weight to each of the plurality of weighted interface edges. In an embodiment, the interface weight value may be defined by the formula $(1+\alpha) \times \beta$, where $\alpha$ is a relative interface complexity factor ranging from 0.0 for a minimum complexity to 1.0 for a maximum complexity and $\beta$ is an architecture importance factor. The factor $\beta$ may be 1.0 for a hardware/software combined architecture and >1.0, e.g., 3.0, for a software architecture. In an embodiment, an interface weight value for each of the plurality of weighted interface edges may be defined as a sum of one divided by a total number of edges connected to a first of the pair of vertices connected to the corresponding weighted interface edge, multiplied by an integration and test cost estimate of the first of the pair of vertices, and one divided by a total number of edges connected to a second of the pair of vertices connected to the corresponding weighted interface edge, multiplied by an integration and test cost estimate of a second of the pair of vertices. The integration and test cost estimate of a vertex may be determined and input by a user based on real-world systems engineering principles relating to the part represented by the vertex. The interface edge weight assigner 720 may include dedicated circuitry or logic that is permanently configured, e.g., as a special-purpose processor, such as an FPGA or an ASIC, or programmable logic or circuitry, e.g., the computing processor 702 that performs operations according to instructions stored in the memory circuit 704.

Figure 8:
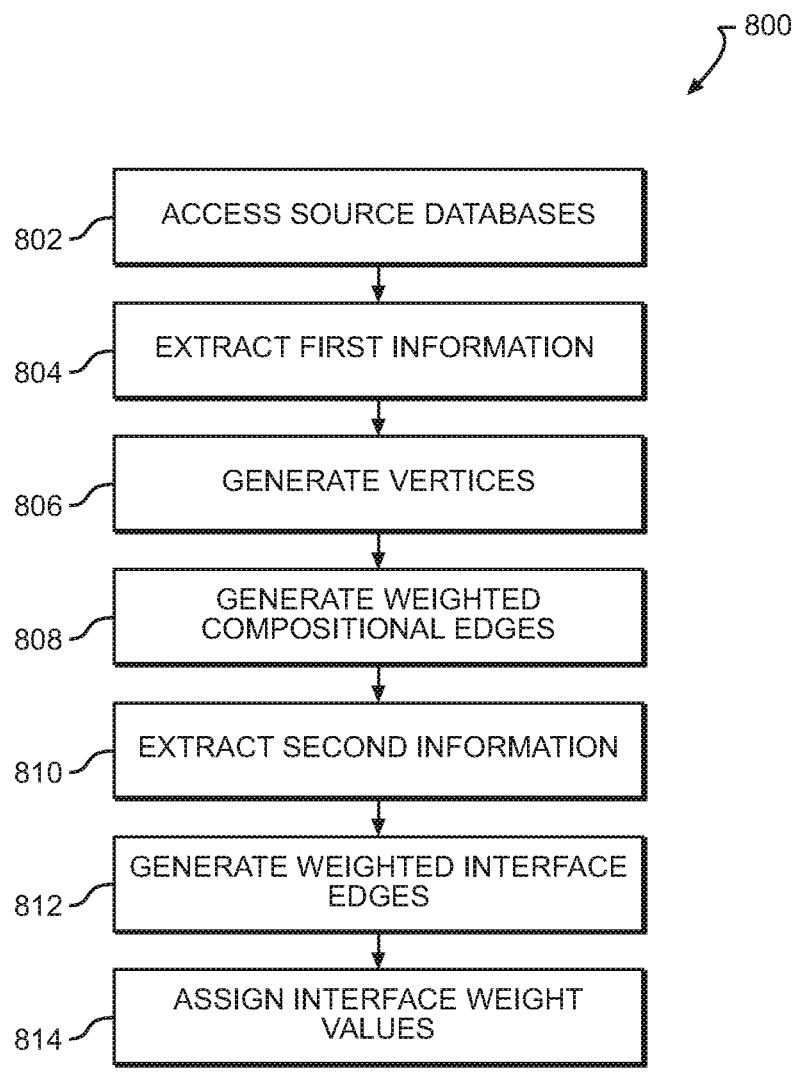
FIG. 8 is a block diagram that illustrates a method of generating a weighted part-to-part coupling graph, in accordance with some embodiments.

FIG. 8 is a block diagram that illustrates a method 800 of generating a weighted part-to-part coupling graph, in accordance with some embodiments. The method 800 may be performed by the system 700 of FIG. 7. FIG. 6B illustrates an exemplary weighted part-to-part coupling graph 610 that may be generated by the method 800. The weighted part-to-part coupling graph may be an embodiment of a property graph data model that includes a plurality of vertices, a plurality of weighted compositional edges, and a plurality of weighted interface edges in a data structure. The plurality of weighted compositional edges may represent directed-composition and directed-decomposition within a vertex type, and the plurality of weighted interface edges may represent information exchange interfaces between vertices. The data structure may be stored in a memory circuit, e.g., the memory circuit 704, of a computer system having a computing processor, e.g., the computing processor 702.

In an operation 802, one or more source databases, such as source databases 110 of FIG. 1, may be accessed by the computing processor. The operation 802 may be performed by the database parser 706 of FIG. 7 or an embodiment of the format converter 120 of FIG. 1. The source databases may include relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in a memory circuit of the computer system, for example, a data structure including a property graph data model generated according to the method 500 described with reference to FIG. 5.

In an operation 804, information pertaining to a plurality of first instances of a first design dimension of the system architecture may be extracted from the one or more source databases. The operation 804 may be performed by the first information extractor 708 of FIG. 7 or an embodiment of the format converter 120 of FIG. 1. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted.

In an operation 806, a plurality of vertices may be generated. Each of the plurality of vertices may represent one first instance of the plurality of first instances. The operation 806 may be performed by the vertex generator 710 of FIG. 7 or an embodiment of the graph constructor 140 of FIG. 1.

In an operation 808, a plurality of weighted compositional edges may be generated. The operation 808 may be performed by the compositional edge generator 712 of FIG. 7 or an embodiment of the graph constructor 140 of FIG. 1. Each of the plurality of weighted compositional edges may connect a different pair of vertices of the plurality of vertices and represent a hierarchical directed-composition or directed-decomposition of one first instance of the plurality of first instances with respect to another first instance of the plurality of first instances. The plurality of weighted compositional edges may represent physical integration of the parts of the parts hierarchy of the system architecture. The plurality of weighted compositional edges may represent physical integration of parts of the parts hierarchy of the system architecture. The plurality of weighted compositional edges may each be assigned a compositional weight value, for example, representing the complexity and/or cost of integration of the lower-level part into the higher-level part. In an embodiment, each of the plurality of weighted compositional edges may be assigned a weight value of one.

In an operation 810, information pertaining to a plurality of second instances of a second design dimension of the system architecture may be extracted from the one or more source databases. The operation 810 may be performed by the second information extractor 414 of FIG. 4 or an embodiment of the format converter 120 of FIG. 1. The second design dimension may be an interface hierarchy between the plurality of parts of the system architecture. The plurality of second instances may be a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections.

In an operation 812, a plurality of weighted interface edges may be generated. Each of the plurality of weighted interface edges may connect a different pair of vertices of the plurality of vertices and represent an information exchange connection between a corresponding pair of first instances of the plurality of first instances according to one or more second instances of the plurality of second instances. The plurality of weighted interface edges may represent information exchange connections between pairs of parts of the parts hierarchy of the system architecture.

In an operation 814, an interface weight value may be assigned to each of the plurality of weighted interface edges. In an embodiment, the interface weight value may be defined by the formula $(1+\alpha)\times\beta$, where $\alpha$ is a relative interface complexity factor ranging from 0.0 for a minimum complexity to 1.0 for a maximum complexity and $\beta$ is an architecture importance factor. The factor $\beta$ may be 1.0 for a hardware/software combined architecture and >1.0, e.g., 3.0, for a software architecture. In an embodiment, an interface weight value for each of the plurality of weighted interface edges may be defined as a sum of one divided by a total number of edges connected to a first of the pair of vertices connected to the corresponding weighted interface edge, multiplied by an integration and test cost estimate of the first of the pair of vertices, and one divided by a total number of edges connected to a second of the pair of vertices connected to the corresponding weighted interface edge, multiplied by an integration and test cost estimate of a second of the pair of vertices. The integration and test cost estimate of a vertex may be determined and input by a user based on real-world systems engineering principles relating to the part represented by the vertex.

Figure 9:
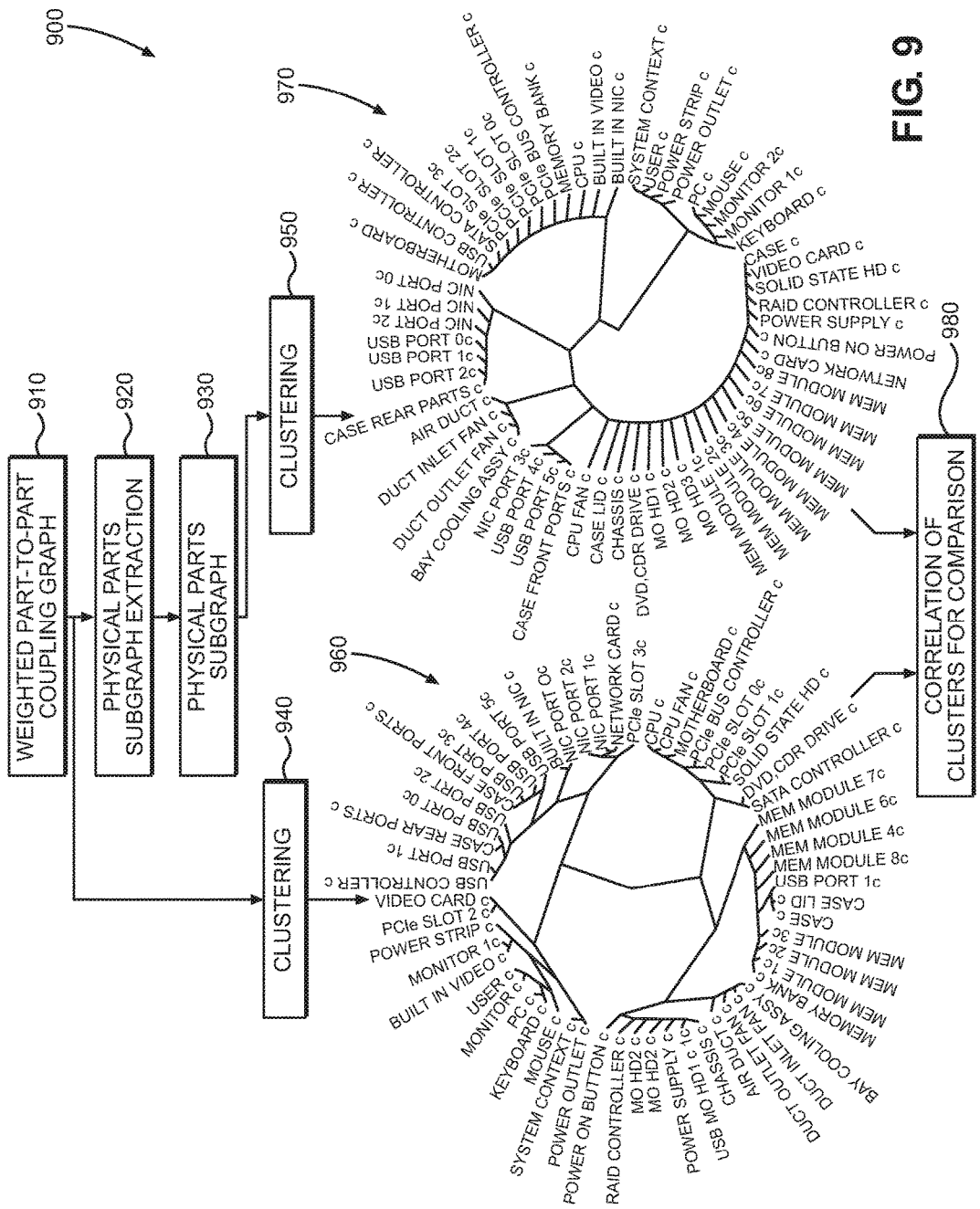
FIG. 9 is a block diagram that illustrates quantifying consistency of a system architecture, in accordance with some embodiments.

FIG. 9 is a block diagram 900 that illustrates quantifying consistency of an exemplary system architecture, in accordance with some embodiments. During the design process for a system, the system architecture may be broken down into a hierarchy of parts, and the parts may be integrated together with information exchange interfaces between them. This is represented by the weighted part-to-part coupling graph described with reference to FIG. 6B. The information exchange interfaces between the parts, represented as an interface edge in FIG. 6B (e.g., interface edges 620 and 630 of FIG. 6B), may introduce coupling between the parts. It is desirable to computationally evaluate the consistency of the physical coupling of the parts of the system architecture with the coupling due to the information exchange interfaces based on the weighted part-to-part coupling graph.

A weighted part-to-part coupling graph 910 may be constructed in a manner similar to that described with reference to FIG. 6B. As an example, the weighted part-to-part coupling graph 910 may represent a computer system. A physical parts subgraph extraction tool 920 may perform an extraction of a physical parts subgraph 930 from the weighted part-to-part coupling graph 910 by copying the weighted part-to-part coupling graph 910 and removing all edges from the copy except compositional edges that represent hierarchical parts composition/decomposition. The physical parts subgraph 930 may include the parts hierarchy of the weighted part-to-part coupling graph 910 without the interface edges (e.g., interface edges 620 and 630 of FIG. 6B) that represent part-to-part couplings of information exchange interfaces. The weightings of the compositional edges may be preserved during the extraction.

Clustering 940 may be performed on the weighted part-to-part coupling graph 910 to generate a hierarchical cluster dendrogram 960 of the system architecture including both a physical hierarchy of parts and information exchange interfaces. Clustering 950 may also be performed on the physical parts subgraph 930 to generate a hierarchical cluster dendrogram 970 of the system architecture including just the physical hierarchy of parts without information exchange interfaces. The hierarchical cluster dendrogram 960 and the hierarchical cluster dendrogram 970 are illustrated graphically as exemplary embodiments, but these should not be construed as limiting, as various different system architectures may generate different representative hierarchical cluster dendrograms. The hierarchical cluster dendrograms 960 and 970 illustrate a plurality of model clusters on their exterior. The hierarchical cluster dendrograms 960 and 970 may be referred to as either clusters or dendrograms. The clustering 940 and 950 may be performed using various network or graph-theoretic clustering algorithms, for example, a Newman & Girvan 2004 edge betweenness algorithm. The weightings of the compositional edges and the interface edges may be used during the clustering 940 and 950.

A correlation of clusters for comparison 980 may be performed on hierarchical clustering dendrograms 960 and 970 to determine a consistency between the system architecture including just the physical hierarchy of parts without information exchange interfaces and the system architecture including both the physical hierarchy of parts and the information exchange interfaces. The correlation may be performed using various network or graph-theoretic correlation algorithms, for example, a Baker's Gamma correlation 1974 algorithm for comparing how closely correlated two hierarchical clusters are to one another. Ideally, the consistency would be represented as a value of 1. When the consistency is not equal to a value of 1, the indication of inconsistency may be used to determine that additional analyses as discussed herein be performed to better understand the source or sources of inconsistency in the system architecture from the source databases. For example, the consistency value and subsequent additional analyses may be used to understand whether the interfaces chosen by a designer or architect are consistent with the physical breakdown of the system. Design decisions may be made based on the consistency evaluation. Therefore, the consistency evaluation results of different system architecture design iterations can be plotted in a graph to see how the design is progressing either relative to a benchmark design of a competing product or relative to some prior revision of the design.

Figure 10:
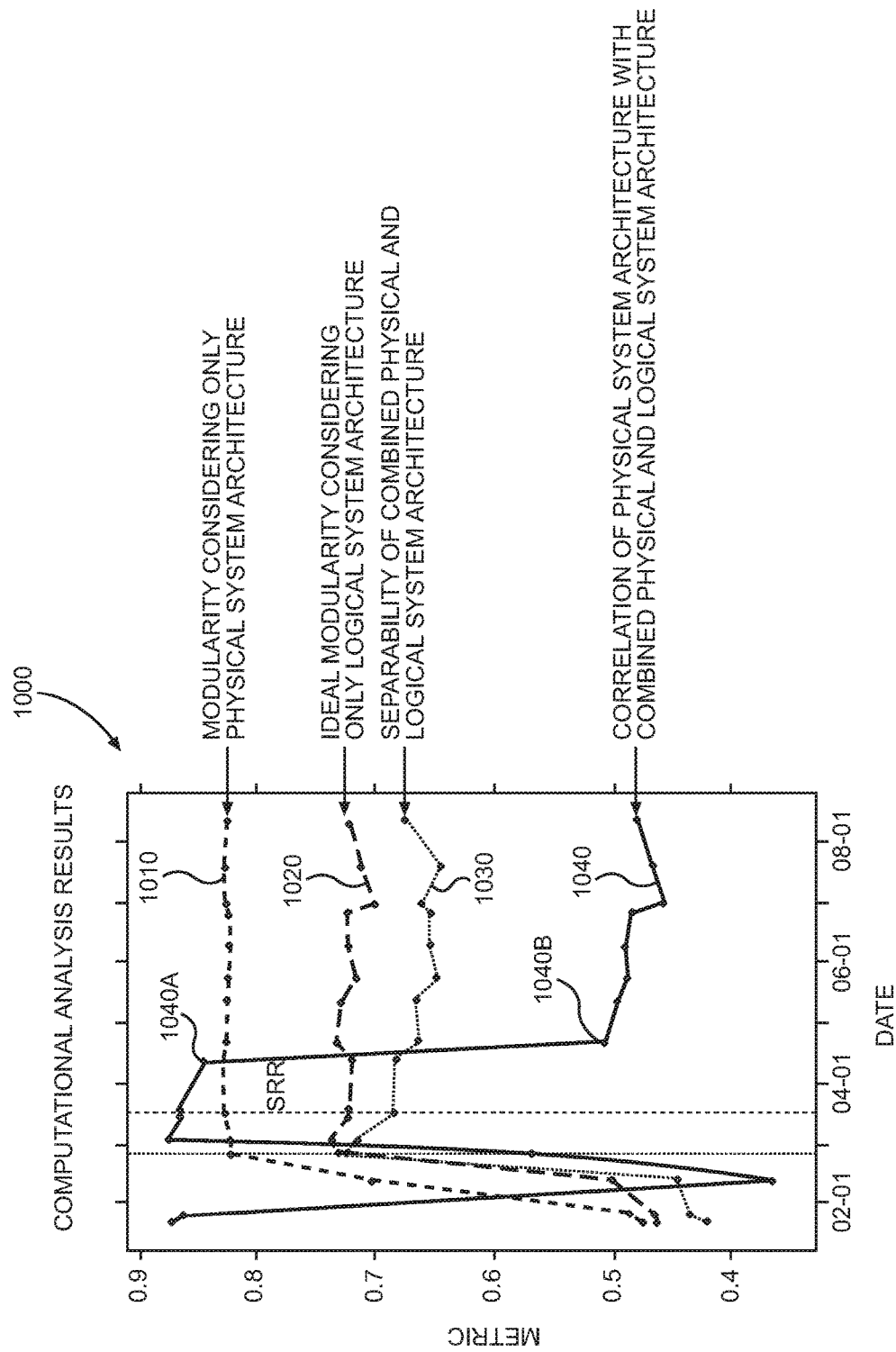
FIG. 10 is a graph that illustrates various exemplary computation analysis results, in accordance with some embodiments.

FIG. 10 is a graph 1000 that illustrates various exemplary computation analysis results, in accordance with some embodiments. The x axis of the graph 1000 represents tune and the y axis of the graph 1000 represents an analysis metric value, with each data point provided for a system architecture design as of the respective date. The graph 1000 illustrates how computational analyses can be used to track the evolution of system architecture analysis metric values over time as the system architecture design evolves. The dotted line annotated SRR refers to a system requirements review date during a system architecture development timeline. Plots 1010, 1020, and 1030 represent modularity metrics.

Modularity metrics can be determined by analyzing the weighted part-to-part coupling graph using well established network and graph-theoretic algorithms, for example, the Clauset-Newman-Moore modularity and community detection algorithms, the Louvain community detection algorithm, and the Girvan-Newman algorithm. The part-to-part coupling graph and the modularity algorithms are well-aligned in terms of how the modularity algorithms operate on the data structure of the part-to-part coupling graph. In determining the modularity of the system architecture, the analysis determines which communities of parts or separable group of parts each part is a member of. The algorithms may take into account both the physical decomposition and how well the interfaces between the parts are aligned to it. An edge betweenness cluster based on the importance of certain paths, for example, based on how common certain paths are in the system architecture may be generated using the physical breakdown of the system in some embodiments or a combination of physical breakdown and interfaces between parts in other embodiments, and then a modularity metric may be applied to see how separable different clusters, or communities, are from one another. The modularity metric may range from 0 to 1, with 0 being not modular at all, and 1 being ideally modular. It is typically desired that the modularity factor be above 0.3 for a modular system architecture.

The plot 1010 represents modularity of the system architecture considering only the physical hierarchy system architecture, and not considering the information exchange connections within the system architecture, when observed over time as the architecture evolves during the design process. This may also be referred to as the modularity of the physical decomposition of the system architecture. The modularity of the physical decomposition in plot 1010 may represent how detailed and consistently broken down the physical parts hierarchy of the system architecture is. The plot 1020 represents an ideal modularity determined by considering only the logical system architecture, when observed over time as the architecture evolves during the design process. The plot 1020 provides guidance on the best modularity that can be achieved, at a given point in the evolution of an architecture, given the information exchange interfaces chosen between parts, with no interface changes and when grouping parts into maximum modularity communities or modules through community detection algorithms. The plot 1030 represents modularity or "separability" of the system architecture, accounting for the physical parts hierarchy of the system architecture and the information exchange interfaces between parts, when observed over time as the architecture evolves during the design process.

In some embodiments, the risk associated with each interface edge in the weighted part-to-part coupling graph may be determined and plotted according to the edge centrality of each interface edge as determined by the Newman & Girvan 2004 edge betweenness centrality algorithm. Interfaces that are determined to have relatively high centrality are also considered to have relatively high risk, and may also reduce modularity, which often conflicts with product design goals. By simplifying the interfaces to reduce the risk, modularity and the robustness of the system architecture may be improved and thus design goals may be readily achieved.

One way to identify what interfaces have the greatest impact on modularity is to determine the modularity of the base weighted part-to-part coupling graph, and then determine the modularity of each weighted part-to-part coupling subgraph generated by removing different interface edges. The weighted part-to-part coupling subgraph having the greatest change in modularity from the base weighted part-to-part coupling graph indicates that modularity of the overall system architecture is the most sensitive to the interface that was removed to generate that weighted part-to-part coupling subgraph. Likewise, the overall system architecture is the next-most sensitive to the interfaces removed to generate the other weighted part-to-part coupling subgraphs that showed the next greatest change, in rank order. This analysis may be used to identify interfaces in the system architecture that may have the greatest impact if simplified or removed to improve the system modularity. Without this insight, the wrong areas of the system architecture design may be focused on during design iterations and modularity may not be improved.

Unlike plots 1010-1030, plot 1040 is not of a modularity metric. The plot 1040 represents the correlation of the physical decomposition alone with the combined physical decomposition and information exchange interfaces between the parts of the system architecture and thus represents the physical to functional alignment of the same, as described with reference to FIG. 9. The plot 1040 illustrates that between datapoints 1040A and 1040B, a design change caused a significant decrease in the consistency of the system architecture. This metric may be sensitive to changes in the physical structure of the system architecture, and illustrate when design changes cause the physical decomposition of the system to become misaligned with respect to the information exchange interfaces or the implicit functional decomposition of the system. A takeaway from the graph 1000 may be that as the consistency decreases and modularity metrics decrease in value, risks for the system increase. For example, when internal consistency of the system architecture decreases abruptly, then design clarity also decreases abruptly. Further, internal consistency can be benchmarked versus past products to provide insight into whether design clarity standards have been met. Internal clarity and consistency reduce implementation and interpretation risks throughout a product's lifecycle.

Figure 11:
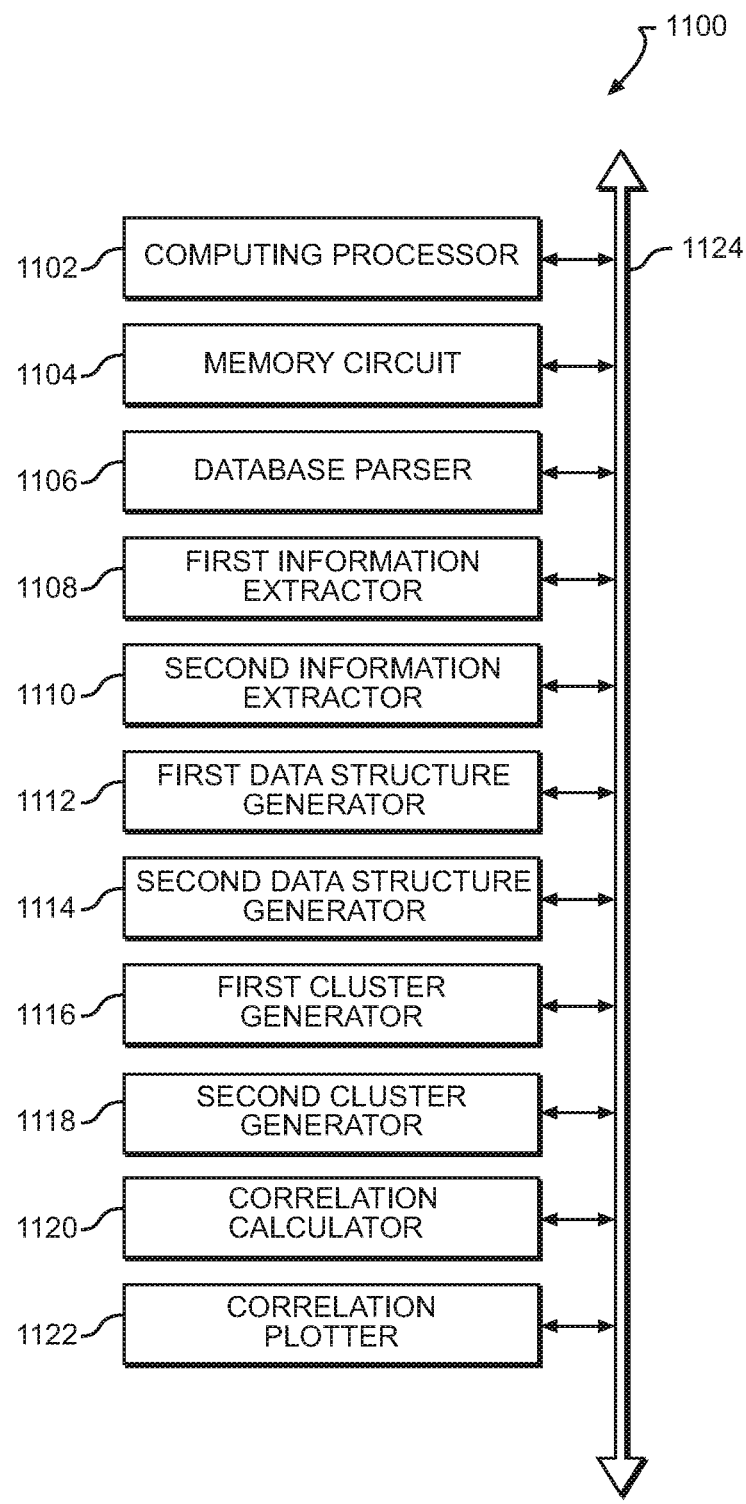
FIG. 11 is a block diagram that illustrates a system for quantifying consistency of a system architecture, in accordance with some embodiments.

FIG. 11 is a block diagram that illustrates a system 1100 for quantifying consistency of a system architecture, in accordance with some embodiments. The system 1100 may include a computing processor 1102 and a memory circuit 1104 that may store a data structure operated on by the computing processor 1102. The memory circuit 1104 may also store a program that when executed performs the method 1200 of FIG. 12. The system 1100 may compare analyses of property graph data models, e.g., the property graph data model 150 of FIG. 1, or weighted part-to-part coupling graph data models, e.g., the weighted part-to-part coupling graph 610 of FIG. 6B, representing different versions of the system architecture. The elements of the system 1100 may communicate with one another via one or more connections or data buses 1124.

The weighted part-to-part coupling graph may be an embodiment of a property graph data model that includes a plurality of vertices, a plurality of weighted compositional edges, and a plurality of weighted interface edges in a data structure. The plurality of weighted compositional edges may represent directed-composition and directed-decomposition within a vertex type, and the plurality of weighted interface edges may represent information exchange interfaces between vertices.

A database parser 1106 may access one or more source databases, such as source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in the memory circuit 1104, for example, a data structure including a property graph data model generated according to the method 500 described with reference to FIG. 5, or a data structure including a weighted part-to-part coupling graph data model generated according to the method 800 described with reference to FIG. 8. The database parser 1106 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A first information extractor 1108 may extract information pertaining to a plurality of first instances of a first design dimension of the system architecture from the one or more source databases. The first information extractor 1108 may include an embodiment of the first information extractors 408 of FIG. 4 or 708 of FIG. 7, or may be included in an embodiment of the format converter 120 of FIG. 1. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted. The first information extractor 1108 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A second information extractor 1110 may extract information from the one or more source databases pertaining to a plurality of second instances of a second design dimension of the system architecture. The second design dimension may be an interface hierarchy between the plurality of parts of the system architecture. The second information extractor 1110 may include an embodiment of the second information extractors 414 of FIG. 4 or 716 of FIG. 7, or may be included in an embodiment of the format converter 120 of FIG. 1. The interface hierarchy may include a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections. The second information extractor 1110 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A first data structure generator 1112 may generate a first data structure representing a first weighted property graph data model. The first weighted property graph data model may be an embodiment of the weighted part-to-part coupling graph 910 of FIG. 9 or the weighted part-to-part coupling graph data model described with reference to FIG. 6B. The first data structure may be generated according to an embodiment of the method 800 described with reference to FIG. 8. The first data structure may include a plurality of first vertices. Each of the first vertices may represent one first instance of the plurality of first instances. The first data structure may also include a plurality of first weighted compositional edges. Each of the plurality of first weighted compositional edges may connect a different pair of first vertices of the plurality of first vertices and represent a hierarchical directed-composition or directed-decomposition of one first instance of the plurality of first instances with respect to another first instance of the plurality of first instances. Each of the plurality of first weighted compositional edges may also be assigned a weight value. The first data structure may include a plurality of first weighted interface edges. Each of the plurality of first weighted interface edges may connect a different pair of first vertices of the plurality of first vertices and represent an information exchange interface between a corresponding pair of first instances of the plurality of first instances according to one or more second instances of the plurality of second instances. Each of the plurality of first weighted interface edges may also be assigned a weight value. The first data structure generator 1112 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A second data structure generator 1114 may generate a second data structure representing a second weighted property graph data model. The second data structure may be an embodiment of the physical parts subgraph 930 of FIG. 9. The second data structure generator 1114 may be an embodiment of the physical parts subgraph extraction tool 920 of FIG. 9. The second weighted property graph data model may be an embodiment of the physical parts subgraph 930 of FIG. 9 or an embodiment of the weighted part-to-part coupling graph data model 610 described with reference to FIG. 6B. The second data structure may include a plurality of second vertices. Each of the second vertices may represent one first instance of the plurality of first instances. The second data structure may also include a plurality of second weighted compositional edges. Each of the plurality of second weighted compositional edges may connect a different pair of second vertices of the plurality of second vertices and represent a hierarchical directed-composition or directed-decomposition of one first instance of the plurality of first instances with respect to another first instance of the plurality of first instances. Each of the plurality of second weighted compositional edges may be assigned a weight value. The second data structure generator 1114 may generate the second data structure by creating a copy of the first data structure and then deleting or removing the weighted interface edges from the copy of the first data structure. The weighted interface edges may be ignored when creating the copy of the first data structure so that they never are created in the copy of the first data structure. The second data structure may be generated in a similar manner as the first data structure as described with reference to the first data structure generator 1112 except for not generating the plurality of first weighted interface edges. The second data structure generator 1114 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A first cluster generator 1116 may generate a combined compositional and interface edge betweenness hierarchical cluster dendrogram of the first data structure. The first cluster generator 1116 may perform an embodiment of the clustering 940 of FIG. 9, and the combined compositional and interface edge betweenness hierarchical cluster dendrogram may be an embodiment of the hierarchical cluster dendrogram 960 of FIG. 9. The combined compositional and interface edge betweenness hierarchical cluster dendrogram may be generated by performing a Newman and Girvan 2004 computation on the first data structure. The first cluster generator 1116 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A second cluster generator 1118 may generate a compositional edge betweenness hierarchical cluster dendrogram of the second data structure. The second cluster generator 1118 may perform an embodiment of the clustering 950 of FIG. 9, and the combined compositional and interface edge betweenness hierarchical cluster dendrogram may be an embodiment of the hierarchical cluster dendrogram 970 of FIG. 9. The compositional edge betweenness hierarchical cluster dendrogram may be generated by performing a Newman and Girvan 2004 computation on the second data structure. The second cluster generator 1118 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A correlation calculator 1120 may calculate a correlation between the combined compositional and interface edge betweenness hierarchical cluster dendrogram and the compositional edge betweenness hierarchical cluster dendrogram. The correlation calculator 1120 may perform an embodiment of the correlation of clusters for comparison 980 of FIG. 9. The correlation may be calculated by performing Baker's Gamma correlation 1974 computation on the combined compositional and interface edge betweenness hierarchical cluster dendrogram and the compositional edge betweenness hierarchical cluster dendrogram. The correlation calculator 1120 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

A correlation plotter 1122 may plot the correlation corresponding to each of a plurality of different system architectures on a common plot, e.g., the plot 1040 of FIG. 10, representing how close the architecture instances are from one another in terms of physical composition and interfaces. The different system architectures may be different design iterations at different dates or milestones of a system architecture development project. The correlation plotter 1122 may include dedicated circuitry or logic that is permanently configured, e.g., as a special-purpose processor, such as an FPGA or an ASIC, or programmable logic or circuitry, e.g., the computing processor 1102 that performs operations according to instructions stored in the memory circuit 1104.

Figure 12:
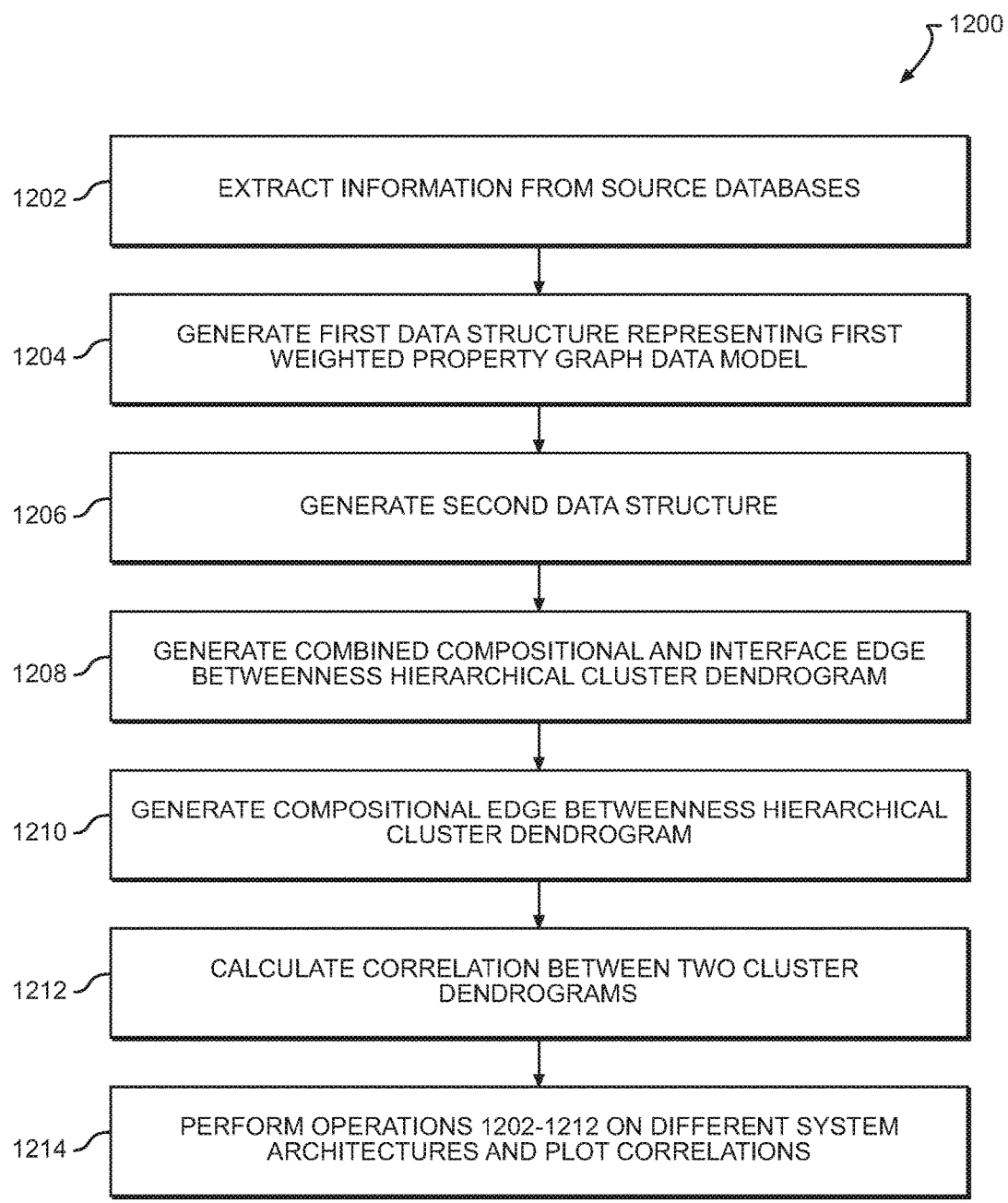
FIG. 12 is a block diagram that illustrates a method of quantifying consistency of a system architecture, in accordance with some embodiments.

FIG. 12 is a block diagram that illustrates a method 1200 of quantifying consistency of a system architecture, in accordance with some embodiments. The method 1200 may be performed by the system 1100 of FIG. 11. The method 1200 may compare analyses of property graph data models or weighted part-to-part coupling graph data models representing different versions of the system architecture. The weighted part-to-part coupling graph may be an embodiment of a property graph data model that includes a plurality of vertices, a plurality of weighted compositional edges, and a plurality of weighted interface edges in a data structure. FIG. 6B illustrates an exemplary weighted part-to-part coupling graph 610. The plurality of weighted compositional edges may represent directed-composition and directed-decomposition within a vertex type, and the plurality of weighted interface edges may represent information exchange interfaces or other interfaces between vertices. The data structure may be stored in a memory circuit, e.g., the memory circuit 1104, of a computer system having a computing processor, e.g., the computing processor 1102, and the method 1100 may be performed by the computing processor.

In an operation 1202, information may be extracted from one or more source databases, such as source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The operation 1202 may be performed by embodiments of the database parser 1106 of FIG. 11, the first information extractor 1108 of FIG. 11, the second information extractor 1110 of FIG. 11, and/or the format converter 120 of FIG. 1. The source databases may include data files for various hardware and/or software tools for design, modeling, and simulation of devices, components, subsystems, and systems included in the system architecture. The source databases may include a data structure stored in a memory circuit of the computer system, for example, a data structure including a property graph data model generated according to the method 500 described with reference to FIG. 5, or a data structure including a weighted part-to-part coupling graph data model generated according to the method 800 described with reference to FIG. 8.

The extracted information may pertain to a plurality of first instances of a first design dimension of the system architecture and a plurality of second instances of a second design dimension of the system architecture. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted. The second design dimension may be an interface hierarchy between the plurality of parts of the system architecture. The plurality of second instances may be a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections.

In an operation 1204, a first data structure representing a first weighted property graph data model may be generated. The first weighted property graph data, model may be an embodiment of the weighted part-to-part coupling graph 910 of FIG. 9 or the weighted part-to-part coupling graph data model 610 described with reference to FIG. 6B. The first data structure may be generated according to an embodiment of the method 800 described with reference to FIG. 8. The first data structure may include a plurality of first vertices representing the plurality of first instances, a plurality of first weighted compositional edges connecting different pairs of first vertices of the plurality of first vertices and representing hierarchical directed-compositions or directed-decompositions of the plurality of first instances, and a plurality of first weighted interface edges connecting different pairs of first vertices of the plurality of first vertices and representing information exchange interfaces between the plurality of first instances according to one or more second instances of the plurality of second instances. The plurality of first weighted compositional edges may represent physical integration of parts of the parts hierarchy of the system architecture. The plurality of first weighted interface edges may represent information exchange interfaces between pairs of parts of the parts hierarchy of the system architecture. Each of the plurality of first weighted compositional edges and each of the plurality of first weighted interface edges may be assigned a weight value.

In an operation 1206, a second data structure equivalent to the first data structure except not including the plurality of first weighted interface edges may be generated. The second data structure may be an embodiment of the physical parts subgraph 930 of FIG. 9, and may be generated using an embodiment of the physical parts subgraph extraction tool 920 of FIG. 9. The second data structure may be generated by creating a copy of the first data structure and then deleting or removing the weighted interface edges from the copy of the first data structure. The weighted interface edges may be ignored when creating the copy of the first data structure so that they never are created in the copy of the first data structure. The second data structure may be generated in a similar manner as the first data structure as described with reference to operation 1204 except for not generating the plurality of first weighted interface edges.

In an operation 1208, a combined compositional and interface edge betweenness hierarchical cluster dendrogram of the first data structure may be generated. The operation 1208 may be an embodiment of performing the clustering 940 of FIG. 9, and the combined compositional and interface edge betweenness hierarchical cluster dendrogram may be an embodiment of the hierarchical cluster dendrogram 960 of FIG. 9. The combined compositional and interface edge betweenness hierarchical cluster dendrogram may be generated by performing a Newman and Girvan 2004 edge betweenness computation on the first data structure.

In an operation 1210, a compositional edge betweenness hierarchical cluster dendrogram of the second data structure may be generated. The operation 1210 may be an embodiment of performing the clustering 950 of FIG. 9, and the compositional edge betweenness hierarchical cluster dendrogram may be an embodiment of the hierarchical cluster dendrogram 970 of FIG. 9. The compositional edge betweenness hierarchical cluster dendrogram may be generated by performing a Newman and Girvan 2004 edge betweenness computation on the second data structure.

In an operation 1212, a correlation between the combined compositional and interface edge betweenness hierarchical cluster dendrogram and the compositional edge betweenness hierarchical cluster dendrogram may be calculated. The operation 1212 may be an embodiment of performing the correlation of clusters for comparison 980 of FIG. 9. The correlation may be calculated by performing Baker's Gamma correlation 1974 computation on the combined compositional and interface edge betweenness hierarchical cluster dendrogram and the compositional edge betweenness hierarchical cluster dendrogram.

In an operation 1214, each of the operations 1202 to 1212 may be performed for a different system architecture, and the correlations corresponding to each of the different system architectures may be plotted on a common plot, e.g., the plot 1040 of FIG. 10. The different system architectures may be different design iterations at different dates or milestones of a system architecture development project.

Figure 13:
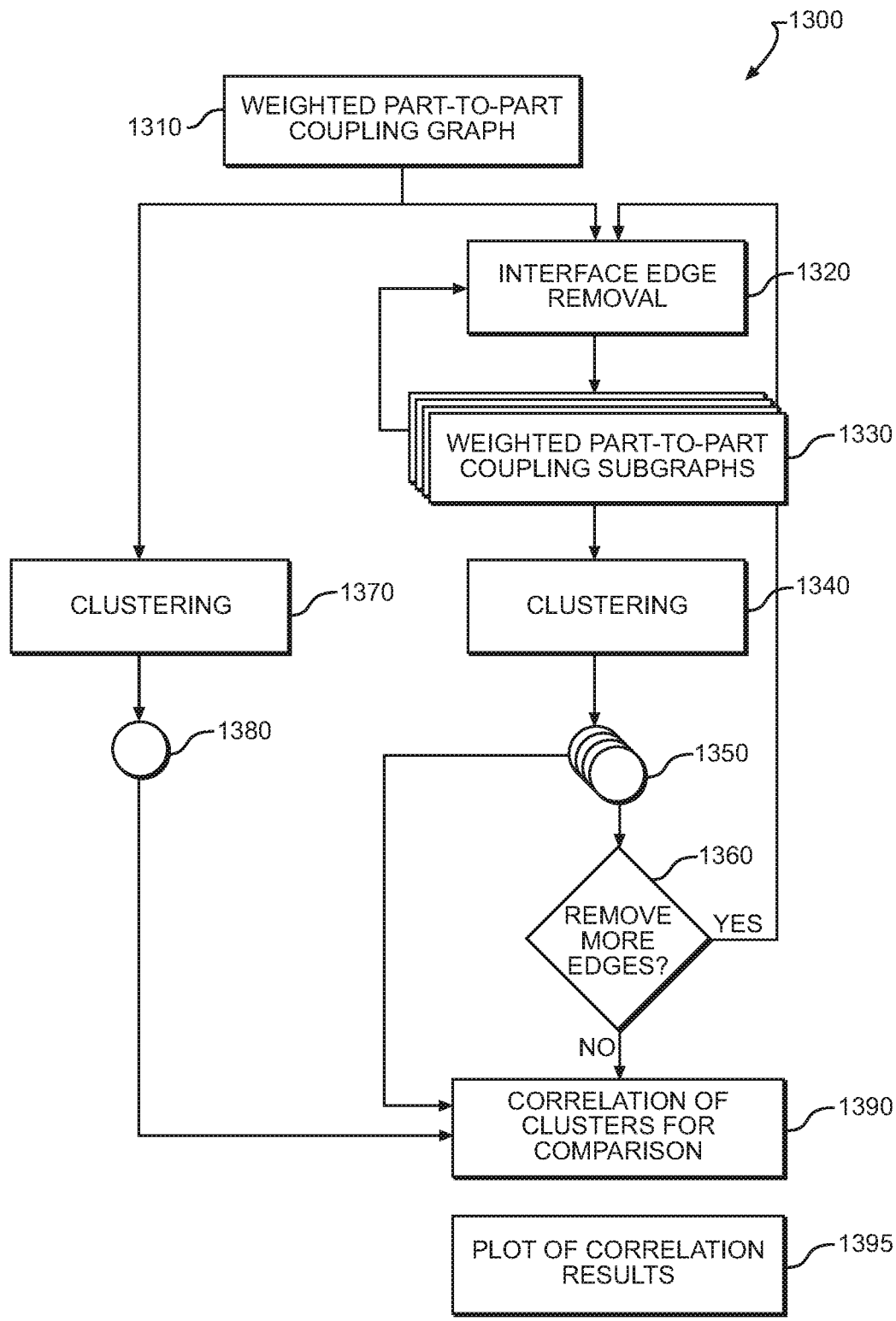
FIG. 13 is a block diagram that illustrates quantifying robustness of a system architecture, in accordance with some embodiments.

FIG. 13 is a block diagram 1300 that illustrates quantifying robustness of a system architecture, in accordance with some embodiments. The robustness of a system architecture design may be computationally evaluated using a hierarchical part-to-part coupling graph, for example, as illustrated and described with reference to FIG. 6B. For example, the robustness and fragility of the system architecture to disturbances in information exchange through the information exchange interfaces can be computationally evaluated. This provides metrics that can aid design decisions from an early stage of the system architecture design all the way through the later detailed design stages to improve reliability and modularity. The metrics from computational analyses of the system architecture design can be utilized to inform and balance trade-offs between modularity and robustness.

Previously, robustness evaluations of a system architecture were not performed computationally. Rather, a reliability expert would be employed to manually develop a costly reliability model and provide a subjective evaluation of the reliability. The development of the reliability model was largely based on component and piece part failure and mean time between failure data which is often not attainable for new designs early enough to have an impact on the architecture. In addition, the component and piece part failure and mean time between failure data does not address the functional reliability aspect of the architecture only the physical reliability aspect. Furthermore, this model may not take into account all of the information relevant to the system architecture due to the reliability expert's translation of architecture to the reliability model. This type of reliability model would also require a detailed design, and not an early-stage coarse design, which would prevent its usefulness for guiding design iterations as the system architecture is designed in greater and greater detail, and therefore was not very useful for improving the reliability of early conceptual system architectures.

Typical network and graph-theoretic algorithms are also not capable of evaluating robustness of the system architecture as represented by the weighted part-to-part coupling graph as illustrated in FIG. 6B. This is because the part-to-part coupling graph has two types of edges, compositional edges and interface edges. Typical network graphs commonly used by network and graph-theoretic algorithms have a single class of edge connecting nodes or vertices and progressively remove edges to evaluate network reliability or robustness based, for example, on the largest remaining component after edges are removed. Even as the interface edges in the part-to-part coupling graph described herein may be individually removed, the compositional edges would remain. Therefore, even if all interface edges are removed, the largest connected component would remain unchanged (e.g., the complete graph of all vertices), making typical network and graph-theoretic algorithms that evaluate network robustness and reliability inapplicable to the weighted part-to-part coupling graph.

A weighted part-to-part coupling graph 1310 may be constructed in a manner similar to that described with reference to FIG. 6B. As an example, the weighted part-to-part coupling graph 1310 may represent a computer system. An interface edge removal tool 1320 may select and remove an interface edge (e.g., interface edges 620 and 630 of FIG. 6B) from the weighted part-to-part coupling graph 1310 and generated a weighted part-to-part coupling subgraph 1330 in its first execution, in subsequent executions, the interface edge removal tool 1320 may remove another interface edge from the last generated weighted part-to-part coupling graph 1330 to generate another weighted part-to-part coupling graph 1330. The interface edge removal tool 1320 may choose an interface edge to remove based on a random selection, or based on an analysis of the weighted part-to-part coupling graph 1310 or weighted part-to-part coupling subgraph 1330 from which the interface edge is being removed, e.g., in an order of edge centrality from most central to peripheral. The edge centrality may be determined according to an edge betweenness centrality algorithm, e.g., Newman & Girvan 2004. The edge removal probability may be based on an empirical probability distribution of the edge centrality. The interface edges may be removed in an order from connections most vulnerable to least vulnerable to attack or change. The use of edge centrality to determine the order of interface edge removal may assume that the attacker has perfect knowledge of the most central interfaces in the system architecture, and attacks the interfaces in order of their centrality. In the case of vulnerability to change, removing central edges first may assume that changes occur as a worst-case scenario.

In an embodiment, each iteration of the interface edge removal tool 1320 may remove an interface edge in decreasing quantile order according to a given quantile sample step size. For example, the interface edge removal tool 1320 may remove an interface edge in decreasing quantile order from 1.0 to 0.0 with a quantile sample step size between 0.1 and 0.25, of edge betweenness centrality. Each weighted part-to-part coupling subgraph 1330 resulting from this process may have increasing numbers of removed interface edges, including one for each quantile sample.

Following the generation of each weighted part-to-part coupling subgraph 1330, clustering 1340 may be performed on the generated weighted part-to-part coupling subgraph 1330 to generate a hierarchical cluster dendrogram 1350 of the system architecture corresponding to the respective generated weighted part-to-part coupling subgraph 1330. The clustering 1340 may be performed using various network or graph-theoretic clustering algorithms that account for edge weight, for example, a Newman & Girvan 2004 edge betweenness algorithm. The weightings of the compositional edges and the interface edges may be used during the hierarchical clustering 1340. A determination 1360 may be made regarding whether more interface edges need to be removed from the latest hierarchical cluster dendrogram 1350. The number of interface edges to be removed may be predetermined ahead of time, for example, by a user, or by a percentage of total number of interface edges in the weighted part-to-part coupling graph 1310. The number of interface edges to remove may be a majority of the interface edges in the weighted part-to-part coupling graph 1310. If there are more interface edges to remove, then an interface edge removal 1320 is performed again to generate another weighted part-to-part coupling subgraph 1330 having one less interface edge than the prior generated weighted part-to-part coupling subgraph 1330. Through the interface edge removal 1320 to clustering 1340 loop, a plurality of hierarchical cluster dendrograms 1350 may be generated, one for each subsequent edge removal from the weighted part-to-part coupling subgraph 1330.

Clustering 1370 may also be performed on the weighted part-to-part coupling graph 1310 to generate a baseline hierarchical cluster dendrogram 1380 of the system architecture including all of the interface edges. The clustering 1370 may be performed using various network or graph-theoretic clustering algorithms, for example, a Newman & Girvan 2004 edge betweenness algorithm. The weightings of the compositional edges and the interface edges may be used during the clustering 1370 to generate the baseline hierarchical cluster dendrogram 1380.

A correlation of clusters for comparison 1390 may be performed on all of the hierarchical cluster dendrograms 1350 in relation to the baseline hierarchical cluster dendrogram 1380, and a plot of correlation results 1395 may be generated, showing the correlation results vs. the number of interface edges removed from the weighted part-to-part coupling graph 1310. The plot of correlation results 1395 may have a number of removed interface edges as its x axis, or a probability of each interface edge removal as its x axis, and the correlation result value as its y axis. The correlation may be performed using various network or graph-theoretic correlation algorithms, for example, a Baker's Gamma correlation 1974 algorithm.

The plotted correlation results 1395 may provide a metric of resiliency or robustness of the system architecture. An embodiment of the plotted correlation results 1395 may include the resiliency profile graph 1600 of FIG. 16. An overall robustness metric may be determined by comparing the median of Gamma correlation when probability of edge removal $p \geq 0.5$ (robustness factor, high damage probability or broad attack) with the same quantity computed when probability of edge removal $p < 0.5$ (fragility factor, low damage probability or narrow attack). The robustness metric may be determined as the median Gamma correlation when 50% or more of the interface edges are removed, and the fragility metric may be determined as one minus the median Gamma correlation when less than 50% of the interface edges are removed. A system architecture may be considered fragile when there is a statistically significant drop in the plotted correlation value after only a few edges have been removed, whereas in a relatively robust system architecture, the plotted correlation value should not drop significantly until a majority of interface edges have been removed. For example, statistical significance may be exemplified by a reduction of functionality after a removal of edges to a value less than a threshold percentage of a highest level of functionality without removal of edges. In various embodiments, the threshold for statistical significance may be 75%, representing a reduction of Gamma to less than 0.75, for example, as illustrated in the y axis of FIG. 16.

When the interface edge removal tool 1320 uses random selection of an interface edge to remove, the entire quantification of robustness process from the weighted part-to-part coupling graph 1310 to the correlation of clusters for comparison 1390 may be repeated many times (e.g., 100 times) with different random selections made in the interface edge removal tool 1320, and the plot of correlation results 1395 may average the correlation results or find the median of the correlation results and plot them vs. probability of an edge removal. When the analysis is performed both with random interface edge removal and with targeted interface edge removal based on edge betweenness centrality (e.g., the interface edges' relative importance in the design of the system architecture), two robustness metrics may result: one due to random selection of interface edges to be removed, and one due to targeted attack on an interface. Both of the robustness metrics relate to functional degradation of the system. The former may be attributed to random failure due to manufacturing variation or producibility, and the latter may be due to malicious attack on an interface by an attacker with perfect knowledge of the vulnerabilities within a design.

Design decisions may be made based on the plotted correlation results 1395 and/or the overall robustness metric. The plot of robustness of the system architecture showing correlation results after having increasing numbers of interface edges removed illustrates how many damaged interfaces the system architecture can tolerate before it become significantly uncorrelated from the original system architecture. As the design progresses, each design iteration may be evaluated for quantifying robustness, and the resulting results plots may be compared to one another. More robust system architectures would tend to have higher correlation results for more removed interface edges than less robust system architectures. The quantifying of robustness may also provide for analysis of functional degradation without developing a separate model for that purpose.

Figure 14:
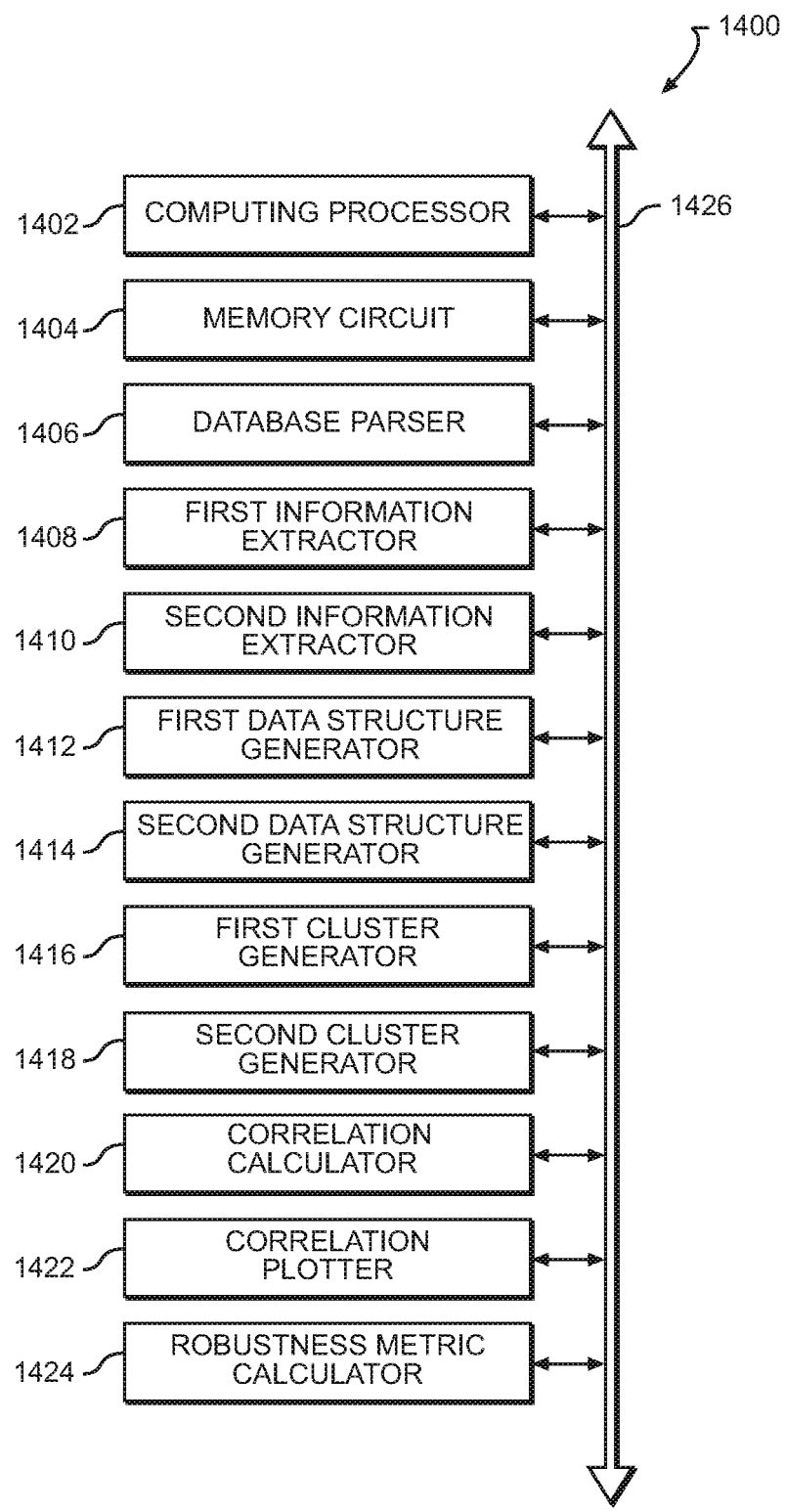
FIG. 14 is a block diagram that illustrates a system for quantifying robustness of a system architecture, in accordance with some embodiments.

FIG. 14 is a block diagram that illustrates a system 1400 for quantifying robustness of a system architecture, in accordance with some embodiments. The system 1400 may include a computing processor 1402 and a memory circuit 1404 that may store data structures operated on by the computing processor 1402. The memory circuit 1404 may also store a program that when executed performs the method 1500 of FIG. 15. The elements of the system 1400 may communicate with one another via one or more connections or data buses 1426.

The system 1400 may compare analyses of a first weighted part-to-part coupling graph data model, e.g., the weighted part-to-part coupling graph 610 of FIG. 6B, representing a system architecture with a second weighted part-to-part coupling graph data model equivalent to the first weighted part-to-part coupling graph data model except for having one or more information exchange interfaces removed to determine how robust the system architecture is to damage resulting from lost information exchange interfaces. The weighted part-to-part coupling graphs may be embodiments of a property graph data model that includes a plurality of vertices, a plurality of weighted compositional edges, and a plurality of weighted interface edges in a data structure. The plurality of weighted compositional edges may represent directed-composition and directed-decomposition within a vertex type, and the plurality of weighted interface edges may represent information exchange interfaces between vertices.

A database parser 1406 may access one or more source databases, such as source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The source databases may include data files for various hardware and/or software tools for design, modeling, and simulation of devices, components, subsystems, and systems included in the system architecture. The source databases may include a data structure stored in the memory circuit 1404, for example, a data structure including a property graph data model generated according to the method 500 described with reference to FIG. 5, or a data structure including a weighted part-to-part coupling graph data model generated according to the method 800 described with reference to FIG. 8. The database parser 1406 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A first information extractor 1408 may extract information pertaining to a plurality of first instances of a first design dimension of the system architecture from the one or more source databases. The first information extractor 1408 may include an embodiment of the first information extractors 408 of FIG. 4, 708 of FIG. 7, or 1108 of FIG. 11, or may be included in an embodiment of the format converter 120 of FIG. 1. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted. The first information extractor 1408 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A second information extractor 1410 may extract information from the one or more source databases pertaining to a plurality of second instances of a second design dimension of the system architecture. The second design dimension may be an interface hierarchy between the plurality of parts of the system architecture. The second information extractor 1410 may include an embodiment of the second information extractors 414 of FIG. 4, 716 of FIG. 7, or 1110 of FIG. 11, or may be included in an embodiment of the format converter 120 of FIG. 1. The interface hierarchy may include a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections. The second information extractor 1410 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A first data structure generator 1412 may generate a first data structure representing a first weighted property graph data model. The first weighted property graph data model may be an embodiment of the weighted part-to-part coupling graph 1310 of FIG. 13 or the weighted part-to-part coupling graph data model 610 described with reference to FIG. 6B. The first data structure may be generated according to an embodiment of the method 800 described with reference to FIG. 8. The first data structure may include a plurality of first vertices. Each of the first vertices may represent one first instance of the plurality of first instances. The first data structure may also include a plurality of first weighted compositional edges. Each of the plurality of first weighted compositional edges may connect a different pair of first vertices of the plurality of first vertices and represent a hierarchical directed-composition or directed-decomposition of one first instance of the plurality of first instances with respect to another first instance of the plurality of first instances. Each of the plurality of first weighted compositional edges may also be assigned a weight value. The first data structure may include a plurality of first weighted interface edges. Each of the plurality of first weighted interface edges may connect a different pair of first vertices of the plurality of first vertices and represent an information exchange interface between a corresponding pair of first instances of the plurality of first instances according to one or more second instances of the plurality of second instances. Each of the plurality of first weighted compositional edges and each of the plurality of first weighted interface edges may be assigned a weight value. The first data structure generator 1412 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A second data structure generator 1414 may generate a second data structure representing a second weighted property graph data model. The second data structure may be equivalent to the first data structure except not including one or more of the first weighted interface edges. The second data structure may be an embodiment of the weighted part-to-part coupling subgraphs 1330 of FIG. 13. The second data structure generator 1414 may be an embodiment of the connecting edge removal 1320 of FIG. 13. The second weighted property graph data model may be an embodiment of the weighted part-to-part coupling graph data model 610 described with reference to FIG. 6B. The second data structure may be generated by creating a copy of the first data structure and then deleting or removing the one or more weighted interface edges from the copy of the first data structure. The one or more weighted interface edges may be ignored when creating the copy of the first data structure so that they never are created in the copy of the first data structure. The second data structure may be generated in a similar manner as the first data structure as described with reference to the first data structure generator 1412 except for not generating the one or more first weighted interface edges.

In an embodiment, generating the second data structure includes generating a plurality of second data structures, each of the plurality of second data structures having a different number of weighted interface edges removed compared to the first data structure. As such, each of the plurality of second data structures may be a different version of the first data structure. There may be a number of second data structures up to a number of the plurality of weighted interface edges in the first data structure. From the first to the last of the plurality of second data structures, an additional weighted interface edge may be removed relative to the first data structure in decreasing quantile order, according to a given quantile sample step size of edge betweenness centrality resulting in a plurality of versions of the first data structure having increasing numbers of removed weighted interface edges, including one for each quantile sample. For example, the quantile order may be decreased from 1.0 to 0.0 with a quantile sample step size between 0.1 and 0.25, of edge betweenness centrality. The resulting plurality of second data structures may be versions of the first data structure having increasing numbers of removed weighted interface edges, including one for each quantile sample. The second data structure generator 1414 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A first cluster generator 1416 may generate a first edge betweenness hierarchical cluster dendrogram of the first data structure. The first cluster generator 1416 may be an embodiment of the first cluster generator 1116 of FIG. 11. The first cluster generator 1416 may perform an embodiment of the clustering 1370 of FIG. 13, and the first edge betweenness hierarchical cluster dendrogram may be an embodiment of the baseline hierarchical cluster dendrogram 1380 of FIG. 13. The first edge betweenness hierarchical cluster dendrogram may be generated by performing a Newman and Girvan 2004 edge betweenness computation on the first data structure. The first cluster generator 1416 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A second cluster generator 1418 may generate a second edge betweenness hierarchical cluster dendrogram of the second data structure. The second cluster generator 1418 may be an embodiment of the second cluster generator 1118 of FIG. 11. The second cluster generator 1418 may perform an embodiment of the clustering 1340 of FIG. 13, and the second edge betweenness hierarchical cluster dendrogram may be an embodiment of the hierarchical cluster dendrograms 1350 of FIG. 13. The second edge betweenness hierarchical cluster dendrogram may be generated by performing a Newman and Girvan 2004 edge betweenness computation on the second data structure. A plurality of second edge betweenness hierarchical cluster dendrograms may be generated, with each of the plurality of second edge betweenness hierarchical cluster dendrograms being of a corresponding one of the plurality of second data structures generated by the second data structure generator 1414. The second cluster generator 1418 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A correlation calculator 1420 may calculate a correlation between the first edge betweenness hierarchical cluster dendrogram and the second edge betweenness hierarchical cluster dendrogram. The correlation calculator 1420 may perform an embodiment of the correlation of clusters for comparison 1390 of FIG. 13. The correlation may be calculated by performing Baker's Gamma correlation 1974 computation on the first edge betweenness hierarchical cluster dendrogram and the second edge betweenness hierarchical cluster dendrogram. A plurality of correlations may be calculated between the first edge betweenness hierarchical cluster dendrogram and corresponding ones of the plurality of second edge betweenness hierarchical cluster dendrograms. The second cluster generator 1418 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A correlation plotter 1422 may plot the plurality of correlations corresponding to each of the plurality of second data structures according to a number of removed weighted interface edges on a common plot. The correlation plotter 1422 may produce an embodiment of the plot of correlation results 1395 of FIG. 13, for example, an embodiment of the resiliency profile graph 1600 of FIG. 16. The plot of the plurality of correlations may represent a resiliency profile of the system architecture. The correlation plotter 1422 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

A robustness metric calculator 1424 may calculate a robustness of the system architecture represented by the one or more source databases to broad and narrow attack according to the plurality of correlations for each of the plurality of second data structures. A robustness to narrow attack may be calculated by a median correlation between the first edge betweenness hierarchical cluster dendrogram and the second edge betweenness hierarchical cluster dendrogram for the plurality of second data structures with an edge betweenness quantile<0.5. A robustness to broad attack may be calculated by the median correlation between the first edge betweenness hierarchical cluster dendrogram and the second edge betweenness hierarchical cluster dendrogram for the plurality of second data structures where each removed edge has an edge betweenness centrality quantile greater than a threshold value, e.g., ≥0.5. The robustness metric calculator 1424 may include dedicated circuitry or logic that is permanently configured, e.g., as a special-purpose processor, such as an FPGA or an ASIC, or programmable logic or circuitry, e.g., the computing processor 1402 that performs operations according to instructions stored in the memory circuit 1404.

Figure 15:
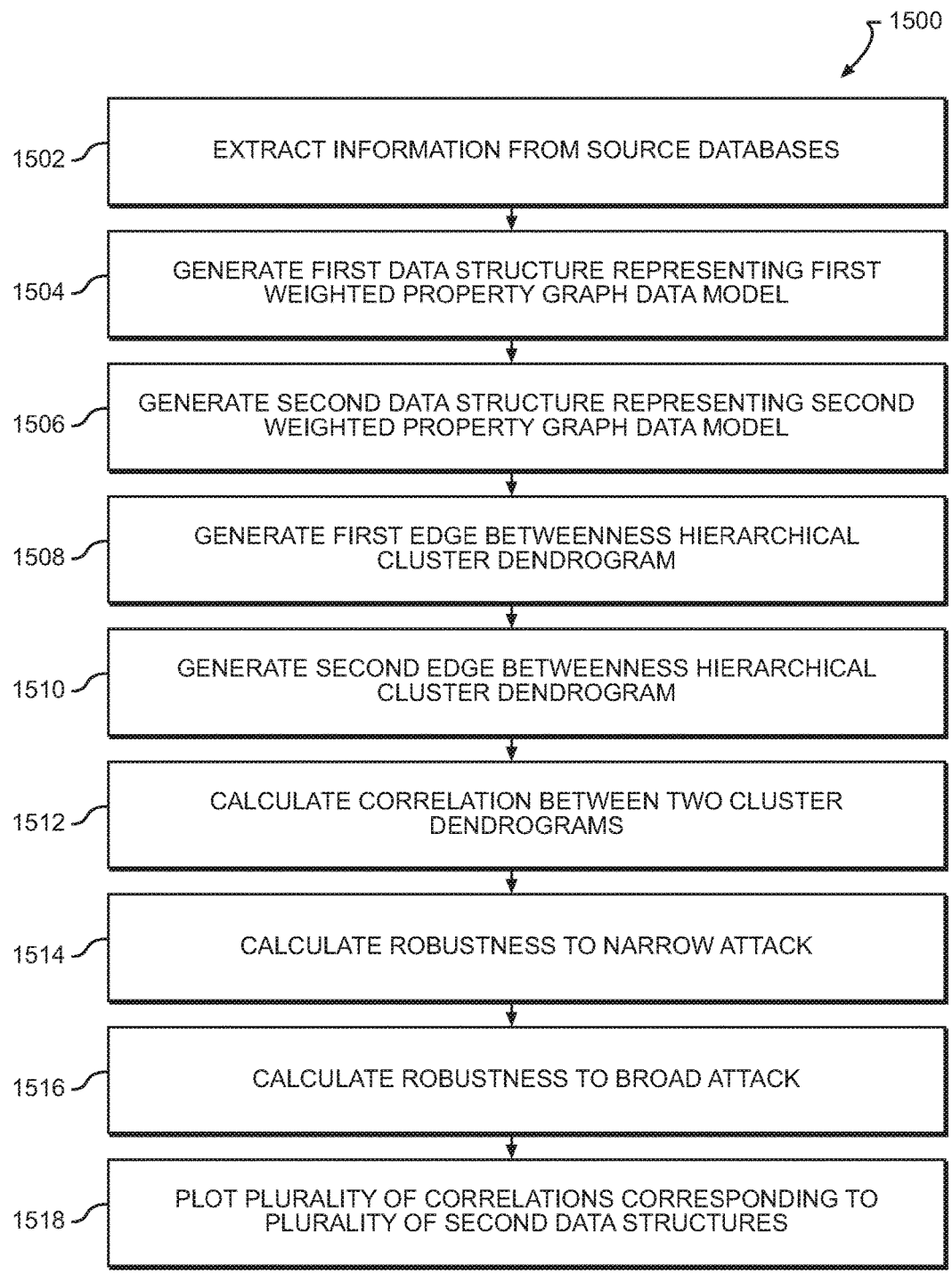
FIG. 15 is a block diagram that illustrates a method of quantifying robustness of a system architecture, in accordance with some embodiments.

FIG. 15 is a block diagram that illustrates a method 1500 of quantifying robustness of a system architecture, in accordance with some embodiments. The method 1500 may be performed by the system 1400 of FIG. 14. The method 1500 may compare analyses of a first weighted part-to-part coupling graph data model representing a system architecture with a second weighted part-to-part coupling graph data model equivalent to the first weighted part-to-part coupling graph data model except for having or one more information exchange interfaces removed to determine how robust the system architecture is to damage resulting in lost information exchange interfaces. The weighted part-to-part coupling graphs may be embodiments of a property graph data model that include a plurality of vertices, a plurality of weighted compositional edges, and a plurality of weighted interface edges in a data structure. FIG. 6B illustrates an exemplary weighted part-to-part coupling graph 610. The plurality of weighted compositional edges may represent directed-composition and directed-decomposition within a vertex type, and the plurality of weighted interface edges may represent information exchange interfaces or other interfaces between vertices. The data structures may be stored in a memory circuit, e.g., the memory circuit 1404, of a computer system having a computing processor, e.g., the computing processor 1402, and the method 1500 may be performed by the computing processor.

In an operation 1502, information may be extracted from one or more source databases, such as source databases 110 of FIG. 1, including relevant characteristics pertaining to a system architecture. The relevant characteristics pertaining to the system architecture may include information pertaining to the design, modeling, simulation, manufacture, operation, testing, performance, reliability, faults, failure, cost, and evaluation of a system architecture. The operation 1502 may be performed by embodiments of the database parser 1406 of FIG. 14, the first information extractor 1408 of FIG. 14, the second information extractor 1410 of FIG. 14, and/or the format converter 120 of FIG. 1. The source databases may include data files for various hardware and/or software tools for design, modeling, and simulation of devices, components, subsystems, and systems included in the system architecture. The source databases may include a data structure stored in a memory circuit of the computer system, for example, a data structure including a property graph data model generated according to the method 500 described with reference to FIG. 5, or a data structure including a weighted part-to-part coupling graph data model generated according to the method 800 described with reference to FIG. 8.

The extracted information may pertain to a plurality of first instances of a first design dimension of the system architecture and a plurality of second instances of a second design dimension of the system architecture. The first design dimension may be a parts hierarchy of the system architecture. The plurality of first instances may be a plurality of parts of the system architecture. Some of the parts may be integrations of others of the parts, and therefore the parts that are integrations of others of the parts may be at a higher level of the hierarchy of parts than the others of the parts. Examples of the parts hierarchy may be represented by the part 210 in the graph schema 200 and the parts A, A.1, A.2, A.3, A.1.1, A.1.2, A.2.1, A.2.2, A.3.1, and A.3.2 of FIG. 3. For example, a circuit card part may be an integration of a plurality of integrated circuit parts and a printed circuit board on which the plurality of integrated circuit parts are mounted, so the circuit card part would be at a higher level of the parts hierarchy than the plurality of integrated circuit parts and the circuit board part on which the plurality of integrated circuit parts are mounted. The second design dimension may be an interface hierarchy between the plurality of parts of the system architecture. The plurality of second instances may be a plurality of interfaces between the plurality of parts of the system architecture. Some of the interfaces may be integrations of others of the interfaces, and therefore the interfaces that are integrations of others of the interfaces may be at a higher level of the hierarchy of interfaces than the others of the interfaces. Examples of the hierarchy of interfaces may be represented by the interface 220 in the graph schema 200 and the interfaces Z, Z.1, Z.2, and X of FIG. 3. For example, a wiring harness may be an integration of a plurality of individual wires, and each individual wire may be an integration of a plurality of communication protocol connections, e.g., Ethernet connections, so the wiring harness would be at a higher level of the interface hierarchy than the plurality of wires, and each wire would be at a higher level of the interface hierarchy than the plurality of communication protocol connections, e.g., Ethernet connections.

In an operation 1504, a first data structure representing a first weighted property graph data model may be generated. The first weighted property graph data model may be an embodiment of the weighted part-to-part coupling graph 1310 of FIG. 13 or the weighted part-to-part coupling graph data model 610 described with reference to FIG. 6B. The operation 1504 may be performed by an embodiment of the first data structure generator 1412 of FIG. 14. The first data structure may be generated according to an embodiment of the method 800 described with reference to FIG. 8. The first data structure may include a plurality of first vertices representing the plurality of first instances, a plurality of first weighted compositional edges connecting different pairs of first vertices of the plurality of first vertices and representing hierarchical directed-compositions or directed-decompositions of the plurality of first instances, and a plurality of first weighted interface edges connecting different pairs of first vertices of the plurality of first vertices and representing information exchange interfaces between the plurality of first instances according to one or more second instances of the plurality of second instances. The plurality of first weighted compositional edges may represent physical integration of parts of the parts hierarchy of the system architecture. The plurality of first weighted interface edges may represent logical information exchange interfaces between pairs of parts of the parts hierarchy of the system architecture. Each of the plurality of first weighted compositional edges and each of the plurality of first weighted interface edges may be assigned a weight value.

In an operation 1506, a second data structure representing a second weighted property graph data model may be generated. The second data structure may be equivalent to the first data structure except not including one or more of the first weighted interface edges. The second data structure may be an embodiment of the weighted part-to-part coupling subgraphs 1330 of FIG. 13, and may be generated using an embodiment of the connecting edge removal 1320 of FIG. 13. The operation 1506 may be performed by an embodiment of the second data structure generator 1414 of FIG. 14. The second weighted property graph data model may be an embodiment of the weighted part-to-part coupling graph data model 610 described with reference to FIG. 6B. The second data structure may be generated by creating a copy of the first data structure and then deleting or removing the one or more weighted interface edges from the copy of the first data structure. The one or more weighted interface edges may be ignored when creating the copy of the first data structure so that they never are created in the copy of the first data structure. The second data structure may be generated in a similar manner as the first data structure as described with reference to operation 1504 except for not generating the one or more first weighted interface edges.

In an embodiment, generating the second data structure includes generating a plurality of second data structures, each of the plurality of second data structures having a different number of weighted interface edges removed compared to the first data structure. As such, each of the plurality of second data structures may be a different version of the first data structure. There may be a number of second data structures up to a number of the plurality of weighted interface edges in the first data structure. From the first to the last of the plurality of second data structures, an additional weighted interface edge may be removed relative to the first data structure in decreasing quantile order, according to a given quantile sample step size of edge betweenness centrality resulting in a plurality of versions of the first data structure having increasing numbers of removed weighted interface edges, including one for each quantile sample. For example, the quantile order may be decreased from 1.0 to 0.0 with a quantile sample step size between 0.1 and 0.25, of edge betweenness centrality. The resulting plurality of second data structures may be versions of the first data structure having increasing numbers of removed weighted interface edges, including one for each quantile sample.

In an operation 1508, a first edge betweenness hierarchical cluster dendrogram of the first data structure may be generated. The operation 1508 may be an embodiment of performing the clustering 1370 of FIG. 13, and the first edge betweenness hierarchical cluster dendrogram may be an embodiment of the baseline hierarchical cluster dendrogram 1380 of FIG. 13. The operation 1508 may be performed by an embodiment of the first cluster generator 1416 of FIG. 14. The first edge betweenness hierarchical cluster dendrogram may be generated by performing a Newman and Girvan 2004 edge betweenness computation on the first data structure.

In an operation 1510, a second edge betweenness hierarchical cluster dendrogram of the second data structure may be generated. The operation 1510 may be an embodiment of performing the clustering 1340 of FIG. 13, and the second edge betweenness hierarchical cluster dendrogram may be an embodiment of the hierarchical cluster dendrograms 1350 of FIG. 13. The operation 1510 may be performed by an embodiment of the second cluster generator 1418 of FIG. 14. The second edge betweenness hierarchical cluster dendrogram may be generated by performing a Newman and Girvan 2004 edge betweenness computation on the second data structure. A plurality of second edge betweenness hierarchical cluster dendrograms may be generated, with each of the plurality of second edge betweenness hierarchical cluster dendrograms being of a corresponding one of the plurality of second data structures generated in operation 1506.

In an operation 1512, a correlation between the first edge betweenness hierarchical cluster dendrogram and the second edge betweenness hierarchical cluster dendrogram may be calculated. The operation 1512 may be an embodiment of performing the correlation of clusters for comparison 1390 of FIG. 13. The operation 1512 may be performed by an embodiment of the correlation calculator 1410 of FIG. 14. The correlation may be calculated by performing Baker's Gamma correlation 1974 computation on the first edge betweenness hierarchical cluster dendrogram and the second edge betweenness hierarchical cluster dendrogram. A plurality of correlations may be calculated between the first edge betweenness hierarchical cluster dendrogram and corresponding ones of the plurality of second edge betweenness hierarchical cluster dendrograms.

In an operation 1514, a robustness to narrow attack may be calculated by a median correlation between the first edge betweenness hierarchical cluster dendrogram and the second edge betweenness hierarchical cluster dendrogram for the plurality of second data structures with an edge betweenness centrality quantile<0.5.

In an operation 1516, a robustness to broad attack may be calculated by the median correlation between the first edge betweenness hierarchical cluster dendrogram and the second edge betweenness hierarchical cluster dendrogram for the plurality of second data structures where each removed edge has an edge betweenness centrality quantile greater than a threshold value, e.g., ≥0.5.

In an operation 1518, a plot of the plurality of correlations corresponding to each of the plurality of second data structures according to a number of removed weighted interface edges may be output. The operation 1518 may be performed by an embodiment of the correlation plotter 1422. The plot of the plurality of correlations may represent a resiliency profile of the system architecture. The operation 1518 may produce an embodiment of the resiliency profile graph 1600 of FIG. 16.

Figure 16:
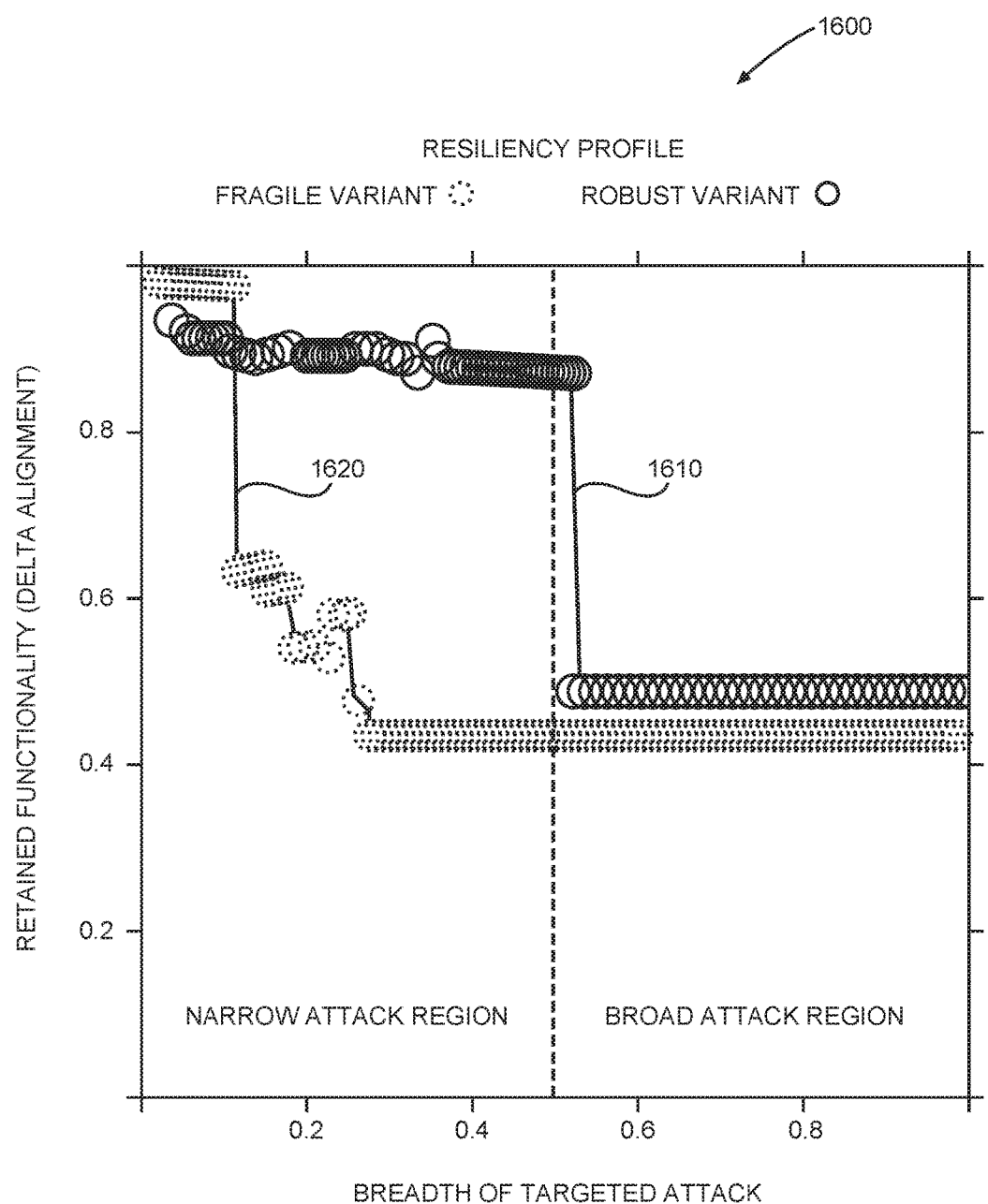
FIG. 16 is a resiliency profile graph that illustrates a resiliency profile of a few different iterations of a system architecture design, in accordance with some embodiments.

FIG. 16 is a resiliency profile graph 1600 that illustrates a resiliency profile 1600, 1610 of a few different iterations of a system architecture design, in accordance with some embodiments. The resiliency profile graph 1600 may be produced by operation 1518 of the method 1500, described with reference to FIG. 15. The resiliency profile 1610 may represent a system architecture design iteration that is robust, indicated by the retained functionality not dropping significantly until after 50% of the breadth of targeted attack is reached. In contrast, the resiliency profile 1620 may represent a system architecture design iteration that is fragile, indicated by the retained functionality dropping significantly before 50% of the breadth of targeted attack is reached. As illustrated, the retained functionality of the system architecture design iteration corresponding to the resiliency profile 1620 drops significantly after about 10% of the breadth of targeted attack is reached.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as an FPGA or an ASIC) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules may provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and store the output of that operation in a memory device to which it is communicatively coupled. A further hardware-implemented module may then, at a later time, access the memory device to retrieve and process the stored output. Hardware-implemented modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., Application Program Interfaces (APIs).)

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor, a computer, or multiple computers.

A computer program may be written in any form of programming language, including compiled or interpreted languages, and it may be deployed in any form, including as a stand-alone program or as a module, subroutine, or other unit suitable for use in a computing environment. A computer program may be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations may also be performed by, and apparatus of example embodiments may be implemented as, special purpose logic circuitry, e.g., an FPGA or an ASIC.

The computing system may include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the claims, along with the full range of equivalents to which such claims are entitled.

What is claimed is:

1. A method for generating a weighted property graph data model representing a computer system architecture, the method comprising:
    accessing, by a computing processor, one or more source databases comprising information pertaining to the computer system architecture;
    extracting information from the one or more source databases pertaining to a plurality of first instances of a first design dimension of the system architecture;
    generating a plurality of first instances, each of the plurality of vertices representing one first instance of the plurality of first instances;
    generating a plurality of weighted compositional edges each of the plurality of weighted compositional edges connecting a different pair of vertices of the plurality of vertices and representing a hierarchical directed-composition or directed-decomposition of one first instance of the plurality of first instances with respect to another first instance of the plurality of first instances;
    assigning a compositional weight value to each of the plurality of weighted compositional edges;
    extracting information from the one or more source databases pertaining to a plurality of second instances of a second design dimension of the system architecture;
    generating a plurality of weighted interface edges, each of the plurality of weighted interface edges connecting a different pair of vertices of the plurality of vertices and representing an information exchange interface between a corresponding pair of first instances of the plurality of first instances according to one or more second instances of the plurality of second instances; and
    assigning an interface weight value to each of the plurality of weighted interface edges;
    wherein the weighted property graph data model representing a system architecture comprises the plurality of vertices, the plurality of weighted compositional edges, and the plurality of weighted interface edges.

2. The method of claim 1, wherein the one or more source databases includes a property graph data model in a second data structure comprising a plurality of vertices of different vertex types, a plurality of compositional edges that connect vertices of a same vertex type and represent hierarchical directed-composition and directed-decomposition within the same vertex type, and a plurality of connecting edges that connect vertices of different vertex types.

3. The method of claim 1, wherein:
    the first design dimension is a parts hierarchy of the system architecture;
    the plurality of first instances are a plurality of parts of the system architecture;
    the second design dimension is an interface hierarchy between the plurality of parts of the system architecture; and
    the plurality of second instances are a plurality of interfaces between the plurality of parts of the system architecture.

4. The method of claim 3, wherein the plurality of weighted compositional edges represent physical integration of parts of the parts hierarchy of the system architecture, and the plurality of weighted interface edges represent information exchange interfaces between pairs of parts of the parts hierarchy of the system architecture.

5. The method of claim 1, wherein the compositional weight value is one and the interface weight value is $(1+\alpha) \times \beta$, where $\alpha$ is a relative interface complexity factor ranging from 0.0 for a minimum complexity to 1.0 for a maximum complexity and $\beta$ is an architecture importance factor.

6. The method of claim 5, wherein $\beta$ is 1.0 for a hardware/software combined architecture and greater than 1.0 for a software architecture.

7. The method of claim 1, wherein the compositional weight value is one and the interface weight value for each of the plurality of weighted interface edges is a sum of one divided by a total number of edges connected to a first of the pair of vertices connected to the corresponding weighted interface edge, multiplied by an integration and test cost estimate of the first of the pair of vertices, and one divided by a total number of edges connected to a second of the pair of vertices connected to the corresponding weighted interface edge, multiplied by an integration and test cost estimate of a second of the pair of vertices.

8. A system for generating a weighted property graph data model representing a system architecture, the system comprising instructions that, when executed by a computing processor, configure the system to implement:
    a database parser that accesses one or more source databases comprising information pertaining to a system architecture;
    a first information extractor that extracts information from the one or more source databases pertaining to a plurality of first instances of a first design dimension of the system architecture,
    a vertex generator that generates a plurality of vertices, each of the plurality of vertices representing one first instance of the plurality of first instances;
    a compositional edge generator that generates a plurality of weighted compositional edges, each of the plurality of weighted compositional edges connecting a different pair of vertices of the plurality of vertices and representing a hierarchical directed-composition or directed-decomposition of one first instance of the plurality of first instances with respect to another first instance of the plurality of first instances;
    a compositional edge weight assigner that assigns a compositional weight value to each of the plurality of weighted compositional edges;
    a second information extractor that extracts information from the one or more source databases pertaining to a plurality of second instances of a second design dimension of the system architecture;
    an interface edge generator that generates a plurality of weighted interface edges, each of the plurality of weighted interface edges connecting a different pair of vertices of the plurality of vertices and representing an information exchange interface between a corresponding pair of first instances of the plurality of first instances according to one or more second instances of the plurality of second instances; and an interface edge weight assigner that assigns an interface weight value to each of the plurality of weighted interface edges;

wherein the weighted property graph data model representing a system architecture comprises the plurality of vertices, the plurality of weighted compositional edges, and the plurality of weighted interface edges.

9. The system of claim 8, wherein the one or more source databases includes a property graph data model in a second data structure comprising a plurality of vertices of different vertex types, a plurality of compositional edges that connect vertices of a same vertex type and represent hierarchical directed-composition and directed-decomposition within the same vertex type, and a plurality of connecting edges that connect vertices of different vertex types.

10. The system of claim 8, wherein:
the first design dimension is a parts hierarchy of the system architecture;
the plurality of first instances are a plurality of parts of the system architecture;
the second design dimension is an interface hierarchy between the plurality of parts of the system architecture; and
the plurality of second instances are a plurality of interfaces between the plurality of parts of the system architecture.

11. The system of claim 10, wherein the plurality of weighted compositional edges represent physical integration of parts of the parts hierarchy of the system architecture, and the plurality of weighted interface edges represent information exchange interfaces between pairs of parts of the parts hierarchy of the system architecture.

12. The system of claim 8, wherein the compositional weight value is one and the interface weight value is $(1+\alpha) \times \beta$, where $\alpha$ is a relative interface complexity factor ranging from 0.0 for a minimum complexity to 1.0 for a maximum complexity and $\beta$ is an architecture importance factor.

13. The system of claim 12, wherein $\beta$ is 1.0 for a hardware/software combined architecture and greater than 1.0 for a software architecture.

14. The system of claim 8, wherein the compositional weight value is one and the interface weight value for each of the plurality of weighted interface edges is a sum of one divided by a total number of edges connected to a first of the pair of vertices connected to the corresponding weighted interface edge, multiplied by an integration and test cost estimate of the first of the pair of vertices, and one divided by a total number of edges connected to a second of the pair of vertices connected to the corresponding weighted interface edge, multiplied by an integration and test cost estimate of the first of the pair of vertices.

15. At least one non-transitory machine-readable medium including instructions that, when executed by a machine, cause the machine to perform the following operations for generating a weighted property graph data model representing a system architecture:
accessing, by a computing processor, one or more source databases comprising information pertaining to a system architecture;
extracting information from the one or more source databases pertaining to a plurality of first instances of a first design dimension of the system architecture;
generating a plurality of vertices, each of the plurality of vertices representing one first instance of the plurality of first instances;
generating a plurality of weighted compositional edges, each of the plurality of weighted compositional edges connecting a different pair of vertices of the plurality of vertices and representing a hierarchical directed-composition or directed-decomposition of one first instance of the plurality of first instances with respect to another first instance of the plurality of first instances;
assigning a compositional weight value to each of the plurality of weighted compositional edges;
extracting information from the one or more source databases pertaining to a plurality of second instances of a second design dimension of the system architecture;
generating a plurality of weighted interface edges, each of the plurality of weighted interface edges connecting a different pair of vertices of the plurality of vertices and representing an information exchange interface between a corresponding pair of first instances of the plurality of first instances according to one or more second instances of the plurality of second instances; and
assigning an interface weight value to each of the plurality of weighted interface edges;
wherein the weighted property graph data model representing a system architecture comprises the plurality of vertices, the plurality of weighted compositional edges, and the plurality of weighted interface edges.

16. The non-transitory machine-readable medium of claim 15, wherein the one or more source databases includes a property graph data model in a second data structure comprising a plurality of vertices of different vertex types, a plurality of compositional edges that connect vertices of a same vertex type and represent hierarchical directed-composition and directed-decomposition within the same vertex type, and a plurality of connecting edges that connect vertices of different vertex types.

17. The non-transitory machine-readable medium of claim 15, wherein:
the first design dimension is a parts hierarchy of the system architecture;
the plurality of first instances are a plurality of parts of the system architecture;
the second design dimension is an interface hierarchy between the plurality of parts of the system architecture; and
the plurality of second instances are a plurality of interfaces between the plurality of parts of the system architecture.

18. The non-transitory machine-readable medium of claim 17, wherein the plurality of weighted compositional edges represent physical integration of parts of the parts hierarchy of the system architecture, and the plurality of weighted interface edges represent information exchange interfaces between pairs of parts of the parts hierarchy of the system architecture.

19. The non-transitory machine-readable medium of claim 15, wherein the compositional weight value is one and the connection weight value is $(1+\alpha) \times \beta$, where $\alpha$ is a relative interface complexity factor ranging from 0.0 for a minimum complexity to 1.0 for a maximum complexity and $\beta$ is an architecture importance factor.

20. The non-transitory machine-readable medium of claim 15, wherein the compositional weight value is one and the interface weight value for each of the plurality of weighted interface edges is a sum of one divided by a total number of edges connected to a first of the pair of vertices connected to the corresponding weighted interface edge, multiplied by an integration and test cost estimate of the first of the pair of vertices, and one divided by a total number of edges connected to a second of the pair of vertices connected to the corresponding weighted interface edge, multiplied by an integration and test cost estimate of the second of the pair of vertices.

* * * * *

UNITED STATES PATENT AND TRADEMARK OFFICE
CERTIFICATE OF CORRECTION

| | | |
|---|---|---|
| PATENT NO. | : 10,430,463 B2 | Page 1 of 1 |
| APPLICATION NO. | : 15/460451 | |
| DATED | : October 1, 2019 | |
| INVENTOR(S) | : Gianetto et al. | |

It is certified that error appears in the above-identified patent and that said Letters Patent is hereby corrected as shown below:

On the Title Page

On page 3, in Column 1, under "Other Publications", Line 6, delete "Hierarchiacal" and insert --Hierarchical-- therefor In the Specification In Column 8, Line 24, after "408", insert --may--

In Column 8, Line 40, after "board", insert --on--

In Column 12, Line 4, after "circuitry,", insert --e.g.,--

In Column 19, Line 61, delete "part-to-part," and insert --part-to-part-- therefor In Column 27, Line 37, delete "tune" and insert --time-- therefor In Column 34, Line 18, delete "data," and insert --data-- therefor In Column 35, Line 57, delete "architecture only" and insert --architecture-only-- therefor In Column 36, Line 28, delete "execution, in" and insert --execution. In-- therefor In Column 45, Line 67, delete "1410" and insert --1420-- therefor In the Claims In Column 50, Line 41, in Claim 8, delete "architecture," and insert --architecture;-- therefor In Column 51, Line 18, in Claim 10, delete "architecture," and insert --architecture;-- therefor Signed and Sealed this
Fifteenth Day of December, 2020

Andrei Iancu
*Director of the United States Patent and Trademark Office*